(12) United States Patent
Kondo et al.

(10) Patent No.: US 6,424,002 B1
(45) Date of Patent: *Jul. 23, 2002

(54) TRANSISTOR, TRANSISTOR ARRAY AND NON-VOLATILE SEMICONDUCTOR MEMORY

(75) Inventors: Sadao Kondo, Ota; Kouichi Yamada; Hideaki Fujiwara, both of Gifu, all of (JP)

(73) Assignee: Sanyo Electric Co., Ltd., Moriguchi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/063,396

(22) Filed: Apr. 21, 1998

(30) Foreign Application Priority Data

Apr. 23, 1997 (JP) .............................................. 9-106431
Mar. 27, 1998 (JP) ........................................... 10-080833

(51) Int. Cl.$^7$ .......................................... H01L 29/788
(52) U.S. Cl. ..................................... 257/316; 257/317
(58) Field of Search ................................ 257/316, 315, 257/318–320, 317; 438/257, 263, 264, 266, 262

(56) References Cited

U.S. PATENT DOCUMENTS

| | | | | |
|---|---|---|---|---|
| 5,021,999 A | | 6/1991 | Kohda et al. | |
| 5,032,881 A | * | 7/1991 | Sardo et al. | 257/316 |
| 5,278,439 A | * | 1/1994 | Ma et al. | 257/315 |
| 5,714,412 A | * | 2/1998 | Liang et al. | 438/266 |
| 5,834,807 A | * | 11/1998 | Kim | 257/315 |
| 5,929,480 A | * | 7/1999 | Hisamune | 257/320 |

FOREIGN PATENT DOCUMENTS

WO   WO 92/18980   10/1992

* cited by examiner

Primary Examiner—Tom Thomas
Assistant Examiner—Thien F. Tran
(74) Attorney, Agent, or Firm—Armstrong, Westerman, & Hattori, LLP

(57) ABSTRACT

A memory cell in a simple structure having a long life, less variations in the structure and writing characteristic, and a higher operation speed, free from the problem of over-erasure, and permitting down-sizing is disclosed. Floating gate electrodes are arranged on a channel region with a gate insulating film therebetween. A control gate is formed on the floating gate electrodes with a tunnel insulating film therebetween. A central part of the control gate electrode is provided on the channel region to form a select gate. Source/drain regions having the select gate therebetween and the select gate form a select transistor. The coupling capacitance between each of the floating gate electrodes and the control gate electrode is set much larger than the coupling capacitance between each of the floating gate electrodes and the substrate.

14 Claims, 24 Drawing Sheets

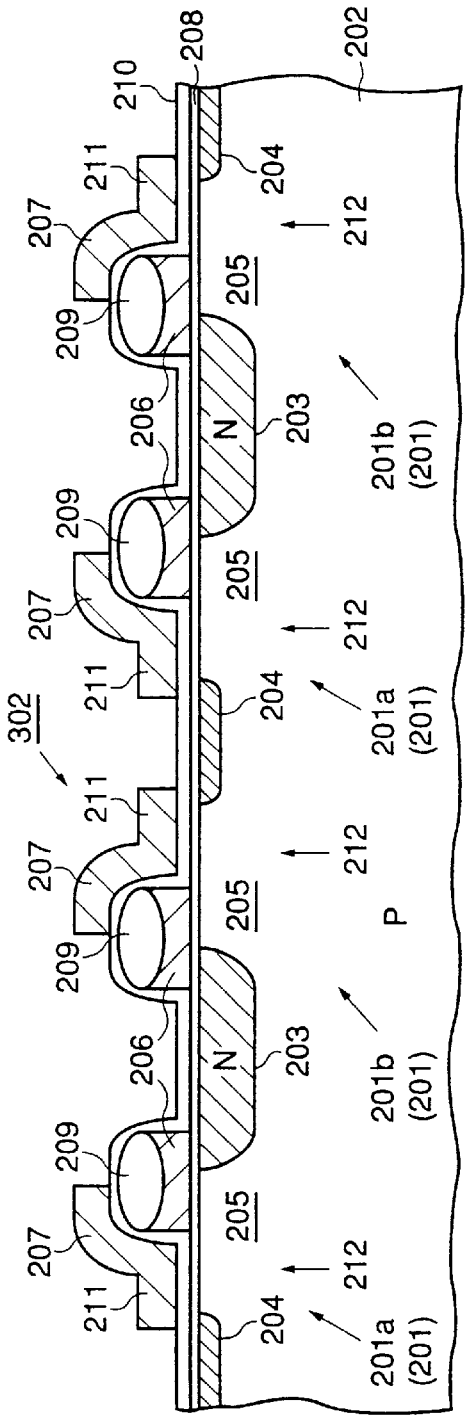
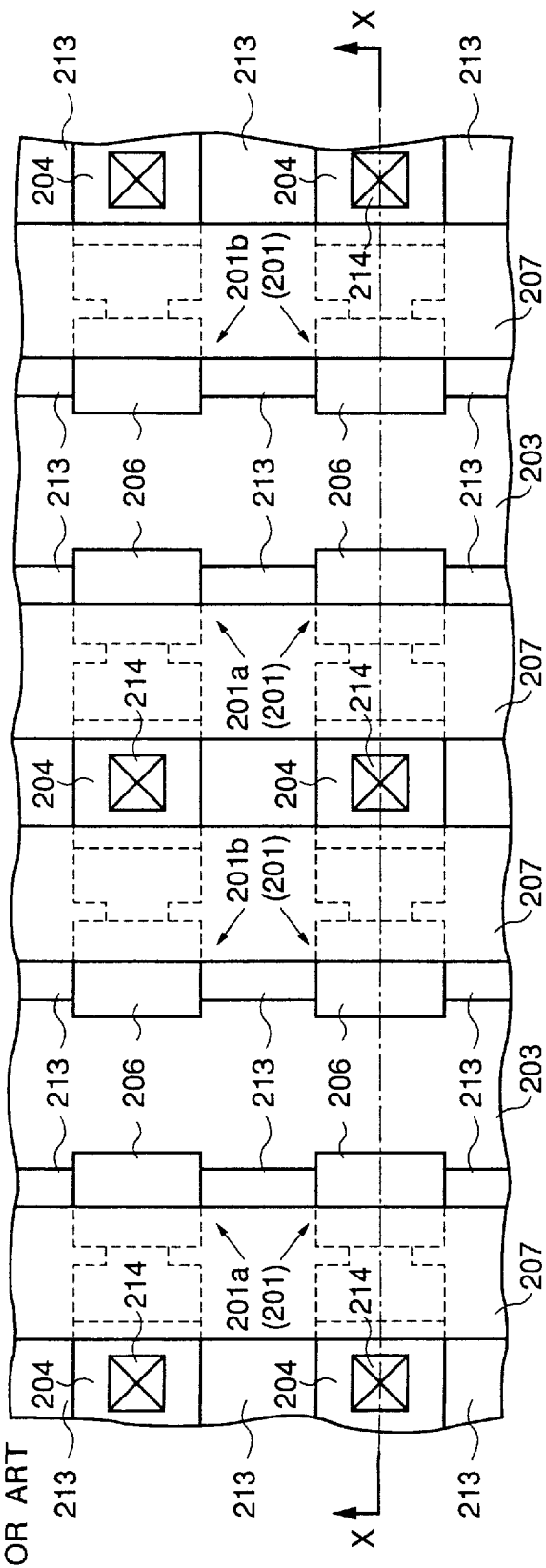
FIG.16A PRIOR ART
FIG.16B PRIOR ART

TRANSISTOR, TRANSISTOR ARRAY AND NON-VOLATILE SEMICONDUCTOR MEMORY

BACKGROUND OF THE INVENTION

1. Field of the Invention

The present invention relates to transistors, transistor arrays and non-volatile semiconductor memories.

2. Description of the Background Art

In recent years, non-volatile semiconductor memories such as Ferro-electric Random Access Memory, EPROM (Erasable and Programmable Read Only Memory), EEPROM (Electrically Erasable and Programmable Read Only Memory) have attracted much attention. In the EPROM or EEPROM, data is stored by storing charge at the floating gate and detecting a change in the threshold voltage based on the presence/absence of charge by a control gate. Such EEPROM includes a flash EEPROM which erases data for the entire memory chip or erases data on the basis of each of arbitrary blocks formed by dividing a memory cell array.

The flash EEPROM has increasing applicabilities such as for a memory for storing programs or data in a mobile telephone or a mobile information terminal for its advantages including: (1) stored data is non-volatile, (2) power consumption is low, (3) data can be electrically rewritten (rewritten on board), (4) the cost is low.

Memory cells forming the flash EEPROM include split-gate or stacked-gate type memory cells.

In flash EEPROM with the stacked-gate type memory cells, if charge is excessively pulled out from the floating gate electrode at the time of erasing data, the channel region attains an on state even if a prescribed voltage (0 V, for example) to drive a memory cell into an off state is applied to the control gate electrode. As a result, the memory cell continuously attains an on state, which disables reading of stored data, in other words, so-called over-erasure is caused. In order to prevent the over-erasure, the procedure of erasure must be devised, the procedure of erasure should be controlled, for example, by a peripheral circuit of the memory device, or by an external circuit.

The split-gate type memory cell was developed to prevent such over-erasure experienced in the stacked-gate type memory cell.

A flash EEPROM using a split-gate type memory cell is disclosed by WO92/18980.

FIG. 15 is a cross sectional view of a conventional split-gate memory cell 201.

Split-gate type memory cell (split-gate type transistor) 201 includes a source region 203, a drain region 204, a channel region 205, a floating gate electrode 206, and a control gate electrode 207.

N type source region 203 and drain region 204 are formed on a P type monocrystalline silicon substrate 202. Floating gate electrode 206 is formed on channel region 205 between source region 203 and drain region 204 with a gate insulating film 208 interposed therebetween. Control gate electrode 207 is formed on floating gate electrode 206 with an insulating film 209 and a tunnel insulating film 210 interposed therebetween. Insulating films 209 and 210 are formed by means of LOCOS (Local Oxidation of Silicon). Insulating film 209 forms raised portions 206a at both corners on the upper part of floating gate electrode 206.

Herein, a part of control gate electrode 207 is disposed on channel region 205 with insulating films 208 and 210 interposed therebetween to form a select gate 211. Select gate 211, source region 203 and drain region 204 form a select transistor 212. More specifically, split-gate type memory cell 201 includes a series-connection of a transistor and select transistor 212 formed of gate electrodes 206 and 207 and regions 203 and 204.

FIG. 16A is a partial cross sectional view of a memory cell array 302 in a flash EEPROM 301 using split-gate type memory cell 201.

Memory cell array 302 includes a plurality of memory cells 201 formed on P-type monocrystalline silicon substrate 202.

Two memory cells 201 (hereinafter also separately referred to as "201a" and "201b") commonly use source region 203 for the purpose of reducing the area occupied by the memory cells on substrate 202, and floating gate electrode 206 and control gate 207 are disposed in an inverted manner to common source region 203.

FIG. 16B is a partial plan view of memory cell array 302. FIG. 16A is a cross sectional view taken along line X—X in FIG. 16B.

A field insulating film 213 is formed on substrate 202, and isolates memory cells. Source region 203 is common to memory cells 201a and 201b provided the longitudinal direction of FIG. 16B. Control gate electrode 207 is common to memory cells 201a and 201b disposed in the longitudinal direction of FIG. 16B, and control gate 207 forms a word line. Each drain region 204 disposed in the transverse direction of FIG. 16B is connected to a bit line (not shown) through a bit line contact 214.

FIG. 17 shows a general configuration of flash EEPROM 301 using split-gate type memory cell 201.

Memory cell array 302 includes a plurality of memory cells 201 formed in a matrix. The control gate electrodes 207 of memory cells 201 arranged in the row-direction form common word lines WL1 to WLn. The drain regions 204 of memory cells 201 arranged in the column-direction are connected to common bit lines BL1 to BLn.

Memory cells-201b connected to odd-numbered word lines (WL1, WL3, . . . , WLm, . . . , WLn−1) and memory cells 201a connected to even-numbered word lines (WL2, WL4, WLm+1, . . . , WLn) respectively commonly use source regions 203, and common source regions 203 form source lines RSL1, . . . , RSLm, . . . , RSLn. Each memory cell 201b connected to word line WLm and each memory cell 201a connected to word line WLm+1, for example, commonly use source region 203, and the common source region 203 forms source line RSLm. Source lines RSL1 to RSLn are connected to a common source line SL.

Word lines WL1 to WLn are connected to a row decoder 303, and bit lines BL1 to BLn are connected to a column decoder 304.

A row address and a column address externally specified are input to an address pin 305. The row address and column address are transferred to an address latch 307 from address pin 305. Among the addresses latched at address latch 307, the row address is transferred to row decoder 303 through an address buffer 306, and the column address is transferred to column decoder 304 through the address buffer 306.

Row decoder 303 selects one of word lines WL1 to WLn (WLm, for example) corresponding to the row address latched at address latch 307, and controls the potential of each of word lines WL1 to WLn according to each operation mode which will be described. More specifically, by controlling the potential of each of word lines WL1 to WLn, the potential of the control gate electrode 207 of each memory cell 201 is controlled.

Column decoder 304 selects one of bit lines BL1 to BLn (BLm, for example) corresponding to the column address latched at address latch 307, and controls the potential of each of bit lines BL1 to BLn corresponding to each operation mode. More specifically, by controlling the potential of each of bit lines BL1 to BLn, the potential of the drain region 204 of each memory cell 201 is controlled.

Common source line SL is connected to a source line bias circuit 312. Source line bias circuit 312 controls the potential of each of source lines RSL1 to RSLn through common source line SL according to each operation mode. More specifically, by controlling the potential of each of source lines RSL1 to RSLn, the potential of the source region 203 of each memory cell 201 is controlled.

Externally specified data is input to data pin 308. The data is transferred to column decoder 304 through an input buffer 309 from data pin 308. Column decoder 304 controls the potential of each of bit lines BL1 to BLn based on the data as will be described later.

Data read out from an arbitrary memory cell 201 is transferred to a sense amplifier 310 through column decoder 304 from a corresponding one of bit lines BL1 to BLn. Sense amplifier 310 is a current sense amplifier. Column decoder 304 connects a selected one of bit lines BL1 to BLn and sense amplifier 310. Data amplified by sense amplifier 310 is externally output through data pin 308 from an output buffer 311.

The operations of the above-described circuits (303 to 313) are controlled by a control core circuit 313.

Operation modes (writing, reading and erasure) of flash EEPROM 301 will be now described in conjunction with FIGS. 18A, 18B and 18C.

(a) Writing (FIG. 18A)

The drain region 204 of a selected memory cell 201 is grounded through a constant current source 310a provided in sense amplifier 310 and has its potential set at about 1.2 V. The potential of the drain region 204 of each memory cell 201 other than the selected memory cell 201 is set at 3 V.

The potential of the control gate electrode 207 of the selected memory cell 201 is set at 2 V. The potential of the control gate electrode 207 of each memory cell 201 other than the selected memory cell 201 is set at 0 V.

The potential of the source regions 203 of all the memory cells 201 is set at 12 V.

In memory cell 201, the threshold voltage Vth of select transistor 212 is at about 0.5 V. Therefore, in selected memory cell 201, electrons in drain region 204 move into channel region 205 in an inverted state. As a result, cell current is passed from source region 203 to drain region 204. Meanwhile, the potential of source region 203 is at 12V, and therefore coupling between source region 203 and floating gate electrode 206 through capacitance raises the potential of floating gate electrode 206 close to 12 V. Hence, a high electric field is generated between channel region 205 and floating gate electrode 206. Electrons in channel region 205 are accelerated to be hot electrons and injected to floating gate 206 as denoted by arrow A in FIG. 18(A). As a result, charge is stored at the floating gate 206 of the selected memory cell 201, and 1-bit data is written and stored.

The writing may be performed on the basis of a selected memory cell 201.

(b) Reading (FIG. 18B)

The potential of the drain region 204 of a selected memory cell 201 is set at 2 V. The potential of the drain region 204 of each memory cell 201 other than the selected memory cell 201 is set at 0 V.

The potential of the control gate electrode 207 of the selected memory cell 201 is set at 4 V. The potential of the control gate electrode 207 of each memory cell 201 other than the selected memory cell 201 is set at 0 V.

The potential of the source regions 203 of all the memory cells 201 is set at 0 V.

As will be described, no charge is stored at the floating gate electrode 206 of a memory cell 201 in an erased state. Meanwhile, charge is stored at the floating gate 206 of a memory cell 201 in a written state as described above. As a result, channel region 205 immediately under the floating electrode 206 of a memory cell 201 in an erased state is in an on state, and channel region 205 immediately under the floating gate electrode 206 of a memory cell 201 in a written state is in an off state. Therefore, when 4 V is applied to control gate electrode 207, cell current passed from drain region 204 to source region 203 is larger for memory cell 201 in the erased state than for memory cell 201 in the written state.

Difference in the level of cell current between memory cells 201 is detected by sense amplifier 310 to read out the value of data stored in memory cell 201. For example, in a reading, the value of data in memory cell 201 in an erased state is represented by "1", and the value of data in memory cell 201 in a written state is represented by "0". More specifically, each memory cell 201 stores either of two values, the data value "1" of the erased state and the data value "0" of the written state, and the data value may be read out.

(c) Erasure (FIG. 18C)

The potential of the drain region 204 of each memory cell 201 is set at 0 V.

The potential of the control gate electrode 207 of a selected memory cell 201 is set at 15 V. The potential of the control gate electrode 207 of each memory cell 201 other than the selected memory cell 201 is set at 0 V.

The source regions 203 of all the memory cells 201 is set to 0 V.

The capacitance between source region 203 and substrate 202 and floating gate 206 is far larger than the capacitance between control gate electrode 207 and floating gate 206. More specifically, floating gate electrode 206 strongly couples source region 203 and substrate 202. As a result, if control gate electrode 207 is at 15 V and drain region 204 is at 0 V, the potential of floating gate electrode 206 does not much change, and the potential difference between control gate electrode 207 and floating gate electrode 206 becomes large, which generates a high electric field between electrodes 207 and 206.

As a result, Fowler-Nordheim Tunnel Current (hereinafter "FN tunnel current") is passed, so that electrons in floating gate electrode 206 are pulled toward control gate electrode 207 as denoted by arrow B, and data stored in memory cell 201 is erased.

At the time, since raised portion 206a is formed at floating gate electrode 206, electrons in floating gate 206 are ejected from raised portion 206a toward control gate electrode 207. As a result, the movement of electrons may be easier, and electrons in floating gate electrode 206 may be efficiently pulled out.

Herein, the control gate electrodes 207 of memory cells 201 arranged in the row-direction form common word lines WL1 to WLn. The erasure is therefore performed to all the memory cells 201 connected to a selected word line WLn.

Note that by selecting a plurality of word lines WL1 to WLn at a time, data in all the memory cells 201 connected to the selected word lines may be erased. Such operation of erasing data on a block-basis by dividing memory cell array 302 into arbitrary blocks each for a plurality of set of word lines WL1 to WLn is called "block erasure".

Flash EEPROM 301 using split-gate type memory cell 201 as described above is provided with select transistor 212, and therefore individual memory cells 201 are capable of selecting themselves. More specifically, if electrons are excessively pulled out from floating gate electrode 206 at the time of data erasure, channel region 205 may be turned off by select gate 211. Therefore if over-erasure is generated, the on/off state of memory cell 201 may be controlled using select transistor 212, in other words the over-erasure is no longer a problem. More specifically, select transistor 212 provided in memory cell 201 may select an on/off state for the memory cell itself.

A method of manufacturing memory cell array 302 will be now described one step after another.

Step 1 (FIG. 19A): A field insulating film 213 (not shown) is formed on substrate 202 by means of LOCOS. A gate insulating film 208 of a silicon oxide film is formed by means of thermal oxidation at a part without field insulating film 213 (element region) on substrate 202. Then, a doped polysilicon film 215 to be floating gate electrode 206 is formed on gate insulating film 208. A silicon nitride film 216 is formed on the entire surface of doped polysilicon film 215 by means of LPCVD (Low Pressure Chemical Vapor Deposition). After applying photoresist on the entire surface of silicon nitride film 216, an etching mask 217 for forming floating gate electrode 206 is formed by means of a normal photolithography technique.

Step 2 (FIG. 19B): Silicon nitride film 216 is anisotropically etched using etching mask 217, followed by removal of etching mask 217. Using thus etched silicon nitride film 216 as an oxidation mask, doped polysilicon film 215 is oxidized by means of LOCOS to form an insulating film 209. At the time, an end of insulating film 209 comes into an end of silicon nitride film 216 to form a bird's beak 209a.

Step 3 (FIG. 19C): Silicon nitride film 216 is removed. Using insulating film 209 as a mask, doped polysilicon film 215 is anisotropically etched to form floating gate electrode 206. At the time, since bird's beak 209a is formed at an end of insulating film 209, an upper edge of floating gate electrode 206 is sharpened along the shape of bird's beak 209a to form raised portion 206a.

Step 4 (FIG. 19D): A tunnel insulating film 210 of a silicon oxide film is formed on the entire surface of the device formed by the process up to the above step by means of thermal oxidation or LPCVD or by both. Then, insulating films 208 and 210, and insulating films 209 and 210 placed upon each other are integrated.

Step 5 (FIG. 19E): A doped polysilicon film 218 to be control gate electrode 207 is formed on the entire surface of the device formed by the process up to the above step.

Step 6 (FIG. 19F): After applying photoresist on the entire surface of the device formed by the process up to the above step, an etching mask 219 for forming control gate electrode 207 is formed using a normal photolithography technique.

Step 7 (FIG. 19G): Using etching mask 219, doped polysilicon film 218 is anisotropically etched to form control gate electrode 207, followed by removal of etching mask 219.

Step 8 (FIG. 19H): After applying photoresist on the entire surface of the device formed by the process up to the above step, a mask 220 for ion injection for forming source region 203 is formed by means of a normal photolithography technique. Then, source region 203 is formed by implanting phosphorous ions ($P^+$) onto the surface of substrate 202 by means of normal ion implantation, followed by removal of mask 220.

At the time, mask 220 is formed to cover at least a part on substrate 202 to be drain region 204 and to be restricted on floating gate electrode 206. As a result, the position of source region 203 is defined by ends of floating gate electrode 206.

Step 9 (FIG. 19I): After applying photoresist on the entire surface of the device formed by the process up to the above step, a mask 221 for ion injection for forming drain region 204 is formed by means of a normal photolithography technique. Then, arsenic ions ($As^+$) are implanted to the surface of substrate 202 by means of normal ion implantation.

At the time, mask 221 is formed to cover at least source region 203 and to be restricted on control gate electrode 207. As a result, the position of drain region 204 is defined by ends of control gate electrode 207 on the side of select gate 211.

Removing mask 221 for ion injection completes memory cell array 302.

Flash EEPROM 301 using split-gate type memory cells 201 is encountered with the following problems.

(1) Mis-registration of mask 219 for forming control gate electrode 207 causes variations in the writing characteristic of memory cells 201.

As shown in FIG. 20A, in step 6, if mask 219 for etching to form control gate electrode 207 is shifted in position relative to memory cells 201a and 201b, the shape of control gate electrode 207 formed in step 7 will be different among memory cells 201a and 201b.

At the time of forming drain region 204 by means of ion implantation in step 9, the position of drain region 204 is defined by ends of control electrode 207 on the side of select gate 211.

Therefore, as shown in FIG. 20A, if mask 219 for etching is shifted in position, the lengths (channel lengths) L1 and L2 of channel regions 205 of memory cells 201a and 201b will be different. Note, however, that if mask 210 is shifted in position, its width will not change, and therefore control gate 207 has the same width if its shape is different. For example, if the position of mask 219 is shifted toward memory cell 201b, the channel length L2 of memory cell 201b is smaller than the channel length L1 of memory cell 201a.

If channel lengths L1 and L2 are different, the resistance of channel regions 205 will be different, which causes difference in the values of cell current passed at the time of writing. More specifically, the longer the channel length, the larger the resistance of channel region 205, and the smaller the cell current passed at the time of writing. If there is a difference between cell current values passed at the time of writing, the frequency of generation of hot electrons will differ. As a result, the writing characteristics of memory cells 201a and 201b will be different.

(2) Down-sizing of memory cell 201 is impeded in order to prevent the problem (1).

In designing split-gate type memory cell 201, in view of the precision of overlapping dimension of gate electrodes 206, 207 in addition to the precision of width size of gate electrodes 206, 207, the positional relation between gate electrodes 206, 207 and regions 203 and 204 should be provided with enough margin. However, in recent downsizing processing of semiconductor, when a thin line having a width of about 0.5 μm is processed, the precision of processing line width size as small as about 0.05 μm is available, while the precision of registration size available is only about in the range from 0.1 to 0.2 μm. More specifically, in split-gate type memory cell 201, the low registration size precision of gate electrodes 206 and 207 prevents down-sizing.

(3) Difficulty of down-sizing a split-gate type memory cell compared to a stacked-gate type memory cell.

The widths of a floating gate electrode and a control gate electrode in a stacked-gate type memory cell are the same, and both gate electrodes are placed upon each other without being shifted from each other. In contrast, in a split-gate type memory cell 201, a part of control gate electrode 207 is placed on channel region 205 to form select gate 211. As a result, in split-gate type memory cell 201, the area occupied by elements on substrate 202 is larger than the stacked-gate type memory cell by the area of select gate 211. In other words, while the split-gate type memory cell is free from the problem of over-erasure, the memory cell is not suitable for high density integration for the above (2) and (3).

(4) The structure of memory cell array 302 using split-gate type memory cells 201 is complicated and takes more man-hours for the manufacture.

The present invention is directed to the above-described problems, and has the following objects.

SUMMARY OF THE INVENTION

It is one object of the invention to provide a transistor free from variations in the writing characteristic, less suffering from over-erasure, and permitting down-sizing.

Another object of the invention is to provide a transistor array using the above-described transistor.

Yet another object of the invention is to provide a non-volatile semiconductor memory using the above-described transistor as a memory cell.

A still further object of the invention is to provide a non-volatile semiconductor memory using the above-described transistor array as a memory cell array.

A transistor according to one aspect of the present invention includes a semiconductor substrate having a main surface, source and drain regions formed on the main surface of the semiconductor substrate and having a channel region interposed therebetween, two floating gate electrodes positioned apart from each other on the channel region, one common control gate electrode extending on the two floating gate electrodes. The coupling capacitance between a floating gate electrode and control gate electrode is set larger than the coupling capacitance between the floating gate electrode and the semiconductor substrate.

A transistor according to another aspect of the invention includes a semiconductor substrate having a main surface, first and second impurity regions to be source/drain regions positioned apart from each other on the main surface of the semiconductor substrate, a channel region positioned between the first and second impurity regions, a gate insulating film formed on the channel region, a first floating gate provided in the vicinity of the first impurity region on the gate insulating film, a second floating gate electrode provided in the vicinity of the second impurity region on the gate insulating film, and a common control gate electrode formed on the first and second floating gate electrodes with a tunnel insulating film interposed therebetween. The coupling capacitance between a floating gate electrode and the control gate electrode is set larger than the coupling capacitance between the floating gate electrode and the semiconductor substrate.

In one embodiment, a transistor has a symmetrical structure relative to a virtual line drawn in the middle between the first and second floating gate electrodes and perpendicular to the main surface of the semiconductor substrate.

In another embodiment, a part of the control gate electrode positioned between first and second floating gate electrodes is positioned along the channel region to form a select gate.

In one operation mode, with a depletion layer expanded from the second impurity region toward the first impurity region, cell current is passed from the second impurity region to the first impurity region, coupling between the control gate electrode and the first floating gate electrode through capacitance causes a high electric field between the channel region and the first floating gate electrode, so that electrons are accelerated to be hot electrons, which are injected to the first floating gate electrode to store charge at the first floating gate electrode and data corresponding to the charge is written and stored.

In another operation mode, the first impurity region is grounded through a constant current source, first voltage is applied to the second impurity region, second voltage at a level higher than the first voltage is applied to the control gate electrode, electrons in the first impurity region move to a channel region in an inverted state, with a depletion layer expanded from the second impurity region toward the first impurity region, cell current is passed from the second impurity region to the first impurity region, coupling between the control gate electrode and the first floating gate electrode through capacitance raises the potential of the first floating gate electrode, a high electric field is generated between the channel region and the first floating gate electrode, which accelerates the electrons to be hot electrons, which are then injected to the first floating gate electrode to store charge at the first floating gate electrode, and data corresponding to the charge is written and stored.

In yet another operation mode, with a depletion layer expanded from the second impurity region towards first impurity region, based on the value of cell current passed from the second impurity region to the first impurity region, the value of data stored at the first floating gate electrode is read out.

In a still further operation mode, with a depletion layer expanded from the second impurity region to the first impurity region, the channel region immediately under the first floating gate electrode in an erased state is in an on state, the channel region immediately under the first floating gate electrode in a written state is in an off state, cell current passed from the second impurity region to the first impurity region is larger for the first floating gate electrode in the erased state than in the written state, and therefore the value of data stored at the first floating gate electrode is read out based on the value of the cell current.

In a still further operation mode, third voltages applied to the second impurity region, fourth voltage lower than the level of the third voltage is applied to the first impurity region, fifth voltage is applied to the control gate, charge is not stored at the floating gate electrode in the erased state with a depletion layer expanding from the second impurity region to the first impurity region, charge is stored at the floating gate electrode in the written state, the channel region immediately under the first floating gate electrode in the erased state is in an on state, the channel region immediately under the first floating gate electrode in the written state is in an off state, cell current passed from the second impurity region to the first impurity region is larger for the first floating gate electrode in the erased state than in the written state, and therefore the value of data stored at the first floating gate electrode is read out based on the value of the cell current.

In a still further operation mode, electrons in the first and second floating gate electrodes are pulled out to the substrate side, and data stored in the first and second floating gate electrodes are erased.

In an additional operation mode, sixth voltage at a constant level is applied to the first and second impurity regions, seventh voltage lower than the level of the sixth voltage is applied to the control gate, the potentials of the first and second floating gate electrodes strongly coupling with the control gate do not change much from the seventh voltage, the potential difference between the first and second impurity regions and the first and second floating gate electrodes becomes large, which generates a high electric field between the first and second impurity regions and the first and second floating gate electrodes, Fowler-Nordheim tunnel current is passed, so that electrons in the first and second floating gate electrodes are pulled out to the side of the substrate, and data stored at the first and second floating gate electrodes are erased.

A transistor array according to one aspect of the invention includes a semiconductor substrate having a main surface, and a plurality of transistors arranged in a matrix on the main surface of the semiconductor substrate. The transistors each include source and drain regions formed on the main surface of the semiconductor substrate having a channel region interposed therebetween, two floating gate electrodes positioned apart from each other on the channel region, and one common control gate electrode extending on the two floating gate electrodes. The coupling capacitance between the floating gate electrode and the control gate electrode is set larger than the coupling capacitance between the floating gate electrode and the semiconductor substrate.

In one embodiment, the control gate electrodes of the transistors arranged in the row-direction form common word lines, and the source/drain regions of the transistors arranged in the column-direction form common bit lines.

In another embodiment, the source/drain regions of the transistors arranged in the row-direction are isolated from each other, and the source/drain regions of the transistors arranged in the column-direction each form an independent bit line for transistors arranged in the row-direction.

In yet another embodiment, the control gate electrodes of the transistors arranged in the row-direction form common word lines, the transistor array is divided into a plurality of cell blocks, the source/drain regions of the transistors arranged in the column-direction in each block form common bit lines, the source/drain regions of the transistors arranged in the row-direction in separate cell blocks are isolated from each other, and the source/drain regions of the transistors arranged in the column-direction in adjacent cell blocks are isolated from each other to form separate bit lines.

In a still further embodiment, the control gate electrodes of the transistors arranged in the row-direction form common word lines, the transistor array is divided into a plurality of cell blocks, the source/drain regions of the transistors arranged in the column-direction in each cell block form common local short bit lines, a global bit line is provided corresponding to each local short bit line, and each local short bit line and each global bit line in each cell block are connected through a switching element.

In an additional embodiment, the floating gate electrodes of the transistors connected to a common word line are arranged in series to form a circuit which is connected in parallel to a common bit line to constitute an AND-NOR type structure.

A non-volatile semiconductor memory according to one aspect of the invention uses the above-described transistor as a memory cell.

A non-volatile semiconductor memory according to the present invention uses the above-described transistor array as a memory cell array.

According to the present invention, a transistor, a transistor array and a non-volatile semiconductor memory in a simple structure, free from variations in the writing characteristic, less suffering from the problem of over-erasure, and permitting down-sizing can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16A is a cross sectional view of the conventional device;

FIG. 16B is a plan view of FIG. 16A, FIG. 16A being a cross section taken along line X—X in FIG. 16B;

DESCRIPTION OF THE PREFERRED EMBODIMENTS

First Embodiment

A first embodiment of the invention will be now described in conjunction with the accompanying drawings.

Figures 1A, 1B:
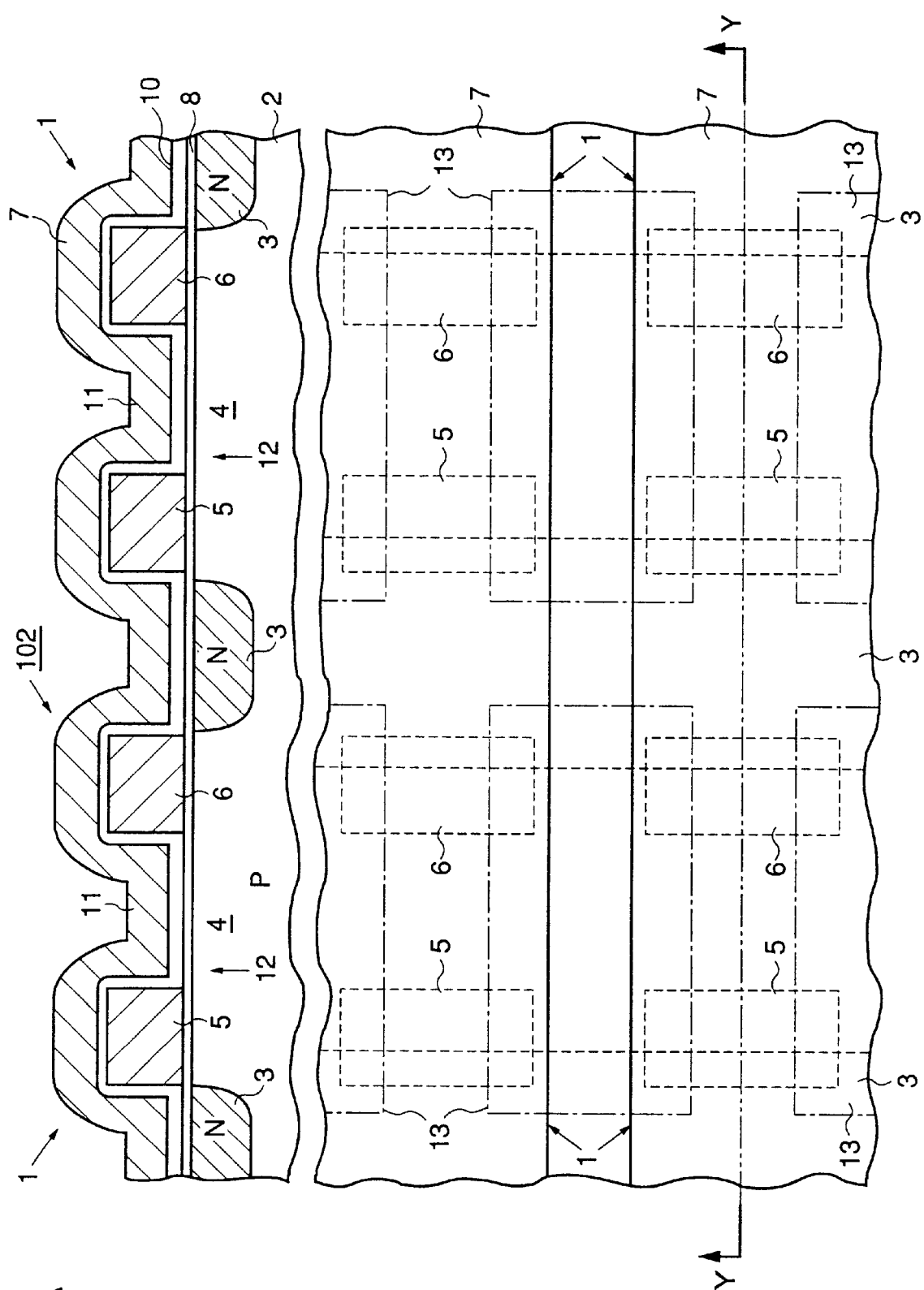
FIG. 1A is a cross sectional view of a first embodiment of the invention.
FIG. 1B is a plan view of FIG. 1A, FIG. 1A being a cross section taken along line Y—Y in FIG. 1B.

FIG. 1A is a partial cross sectional view of a memory cell array 102 in a flash EEPROM 101 using a memory cell 1 according to the embodiment.

Memory cell (transistor) 1 includes two source/drain regions 3, a channel region 4, two floating gate electrodes 5 and 6, and a control gate electrode 7.

N type source/drain regions 3 are formed on P type monocrystalline silicon substrate 2. Two floating gate electrodes 5 and 6 in the same size are formed next to each other on channel region 4 between two source/drain regions 3 with a gate insulating film 8 interposed therebetween to form a symmetrical structure. A control gate 7 is formed on each of floating gate electrodes 5 and 6 with a tunnel insulating film 10 therebetween.

Herein, a part of control gate electrode 7 is disposed on channel region 4 with insulating film 8 and 10 therebetween to form a select gate 11. Source/drain regions 3 having select gate 11 therebetween and select gate 11 form a select transistor 12. More specifically, memory cell 1 includes a series-connection of two transistors and select transistor 12 formed between the transistors which consist of floating gate electrodes 5 and 6, control gate electrode 7 and source/drain regions 3.

Memory cell array (transistor array) 102 includes a plurality of memory cells 1 formed on a substrate 2. Adjacent memory cells 1 commonly use a source/drain region 3 for the purpose of reducing the area occupied by memory cell array 102 on substrate 2.

FIG. 1B is a partial plan view of memory cell array 102. FIG. 1A is a cross sectional view taken along line Y—Y in FIG. 1B.

A field insulating film 13 is formed on substrate 2, and field insulating film 13 isolates between memory cells 1.

Memory cells 1 arranged in the longitudinal direction of FIG. 1B have a common source/drain region, and source/drain region 3 forms a bit line. Memory cells 1 arranged in the transverse direction of FIG. 1B have a common control gate electrode 7, which forms a word line.

In FIGS. 1A and 1B, the coupling capacitance (capacitance) C1 between floating gate electrode 5(6) and control gate electrode 7 is set much larger than the coupling capacitance (capacitance) C2 between floating gate electrode 5(6) and substrate 2 (source/drain region 3a(3b) and channel region 4). In order to implement the above relationship, the following methods for example may be employed.

i) If the same material is used for insulating films 8 and 10, the thickness of insulating film 10 between floating gate electrode 5(6) and control gate electrode 7 is set smaller than the thickness of insulating film 8 between floating gate electrode 5(6) and substrate 2.

ii) If the thickness of insulating films 8 and 10 is the same, a material of a high dielectric constant such as $Si_3N_4$ is used for insulating 10, and a material of a low dielectric constant such as $SiO_2$ is used for insulating film 8.

iii) If the material and thickness of insulating films 8 and 10 are the same, the overlapping area of floating gate electrode 5(6) and control gate electrode 7 is set larger than the overlapping area of floating gate electrode 5(6) and substrate 2.

iv) The above i) to iii) may be combined as required.

Figure 2:
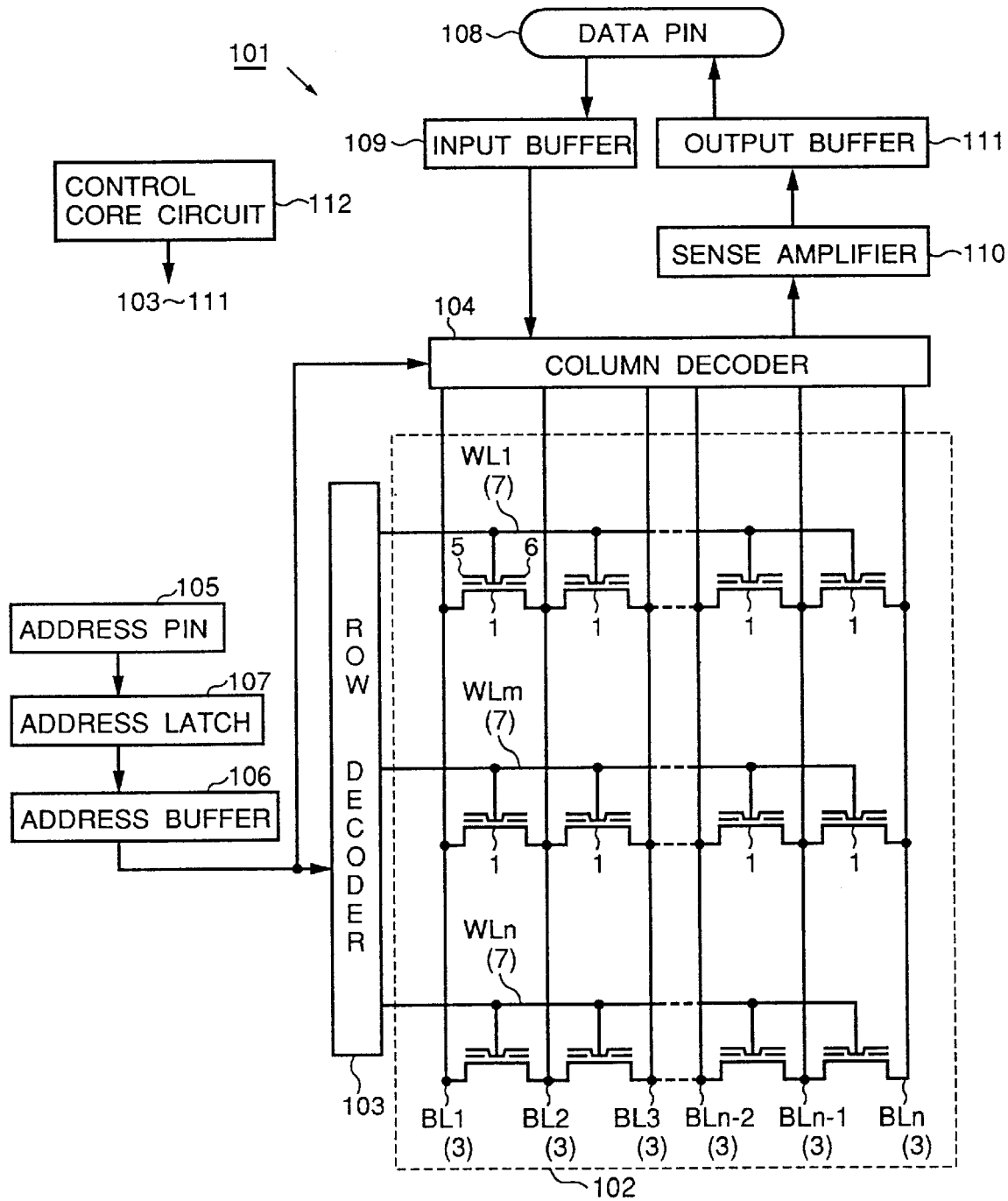
FIG. 2 is a circuit diagram of the first embodiment.

FIG. 2 shows a general structure of flash EEPROM 101 using memory cell 1.

Memory cell array 102 includes a plurality of memory cells arranged in a matrix. The control gate electrodes 7 of memory cells 1 arranged in the row-direction form common word lines WL1 to WLn. The source/drain region 3 of memory cells arranged in the column-direction form common bit lines BL1 to BLn.

More specifically, memory cell array 102 has an AND-NOR structure in which the floating gate electrodes 5 and 6 of memory cells 1 connected to common word lines WL1 to WLn are arranged in series to form a circuit which is connected in parallel to common bit lines BL1 to BLn.

Word lines WL1 to WLn are connected to row decoder 103, and bit lines BL1 to BLn are connected to column decoder 104.

Externally specified row and column addresses are input to an address pin 105. The row and column addresses are transferred to an address latch 107 from address pin 105. Among the addresses latched at address latch 107, the row address is transferred to row decoder 103 through an address buffer 106, and the column address is transferred to column decoder 104 through address buffer 106. Note that address latch 107 may be omitted if not necessary.

Row decoder 103 selects one of word lines WL1 to WLn (WLm (not shown), for example) corresponding to the row address latched at address latch 107, and controls the potential of the word line in each operation mode as will be described. More specifically, by controlling the potential of the word line, the potential of control gate electrode 7 of memory cell 1 is controlled.

Column decoder 104 controls the potential or open state of each of bit lines BL1 to BLn corresponding to each operation mode which will be described for selecting one of bit lines BL1 to BLn (BLm (not shown), for example) corresponding to the column address latched at address latch 107. More specifically, the potential or open state of each of bit lines BL1 to BLn is controlled to control the potential or open state of source/drain region 3 of memory cell 1.

Externally specified data is input to data pin 108. The data is transferred to column decoder 104 through an input buffer 109 from data pin 108. Column decoder 104 controls the potential or open state of each of bit lines BL1 to BLn based on the data as will be described.

Data read out from arbitrary memory cell 1 is transferred from one of bit lines BL1 to BLn to a sense amplifier 110 through column decoder 104. Sense amplifier 110 is a current sense amplifier. Column decoder 104 connects bit lines BL1 to BLn to sense amplifier 110. Data determined by sense amplifier 110 is externally output through data pin 108 from an output buffer 111.

The operations of the above-described circuits (103 to 111) are controlled by a control core circuit 112.

Figure 3:
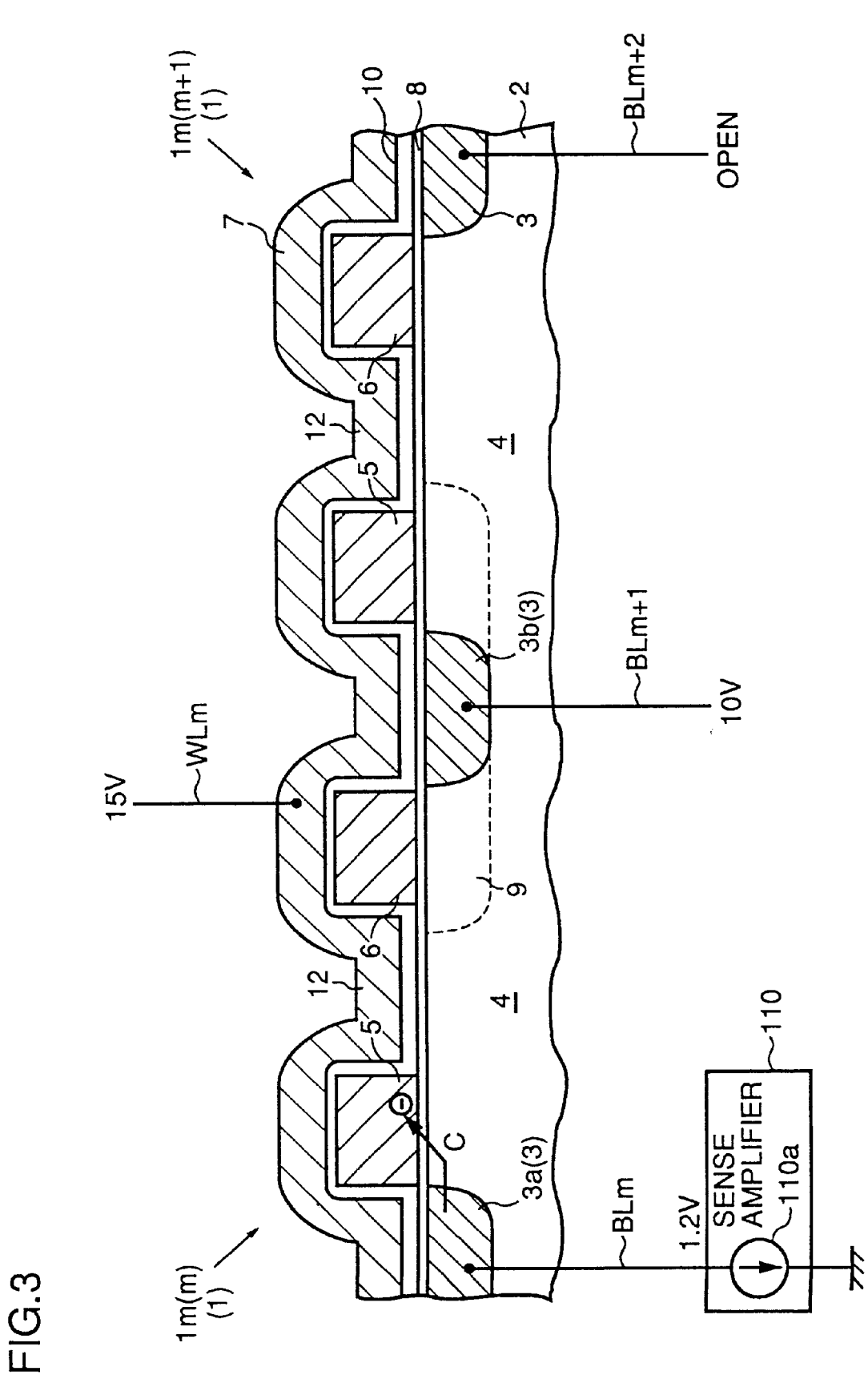
FIG. 3 is a cross sectional view of a main part for use in illustration of the function of the first embodiment.
Figure 4:
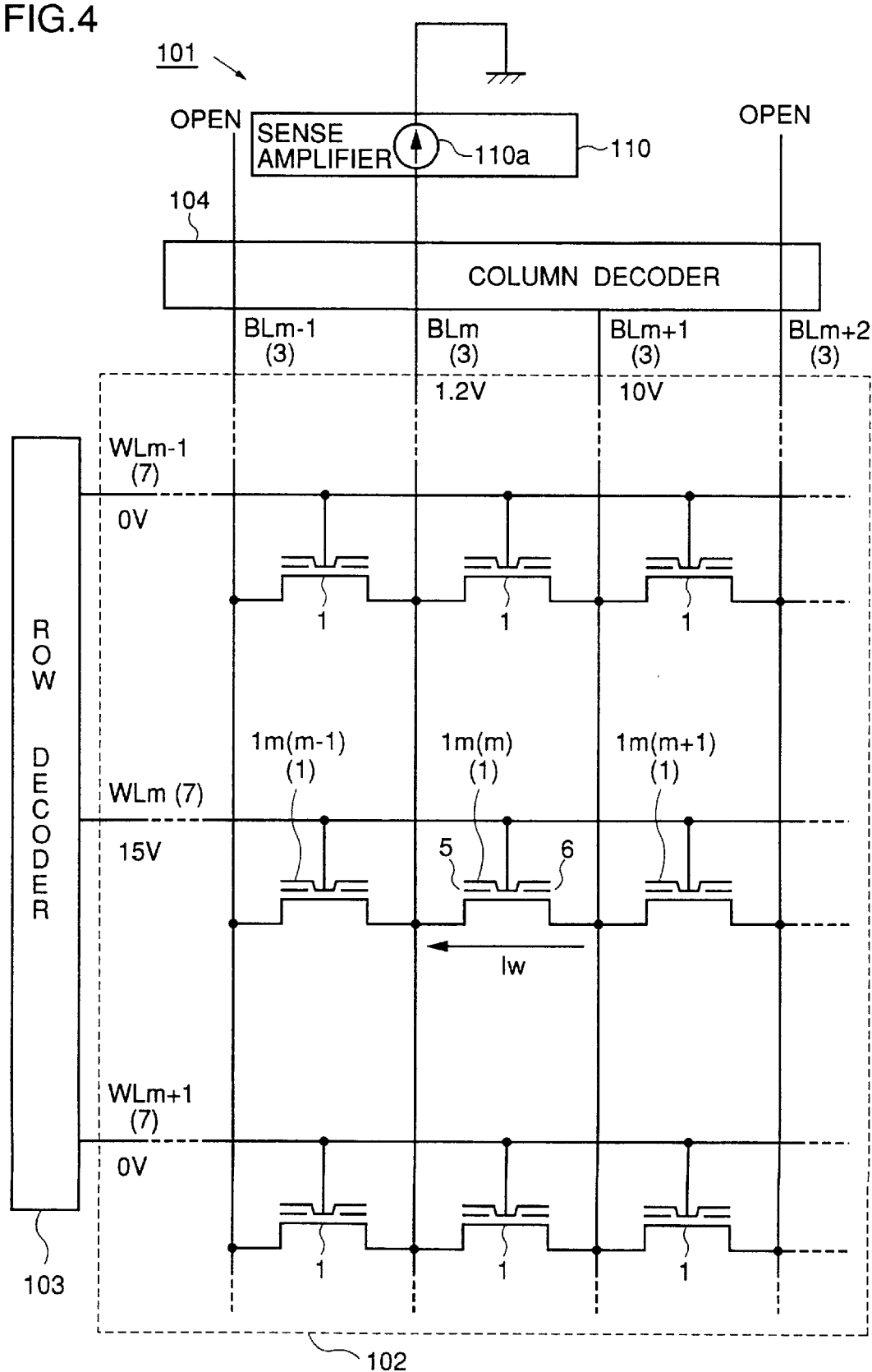
FIG. 4 is a circuit diagram of the main part for use in illustration of the function of the first embodiment.
Figure 5:
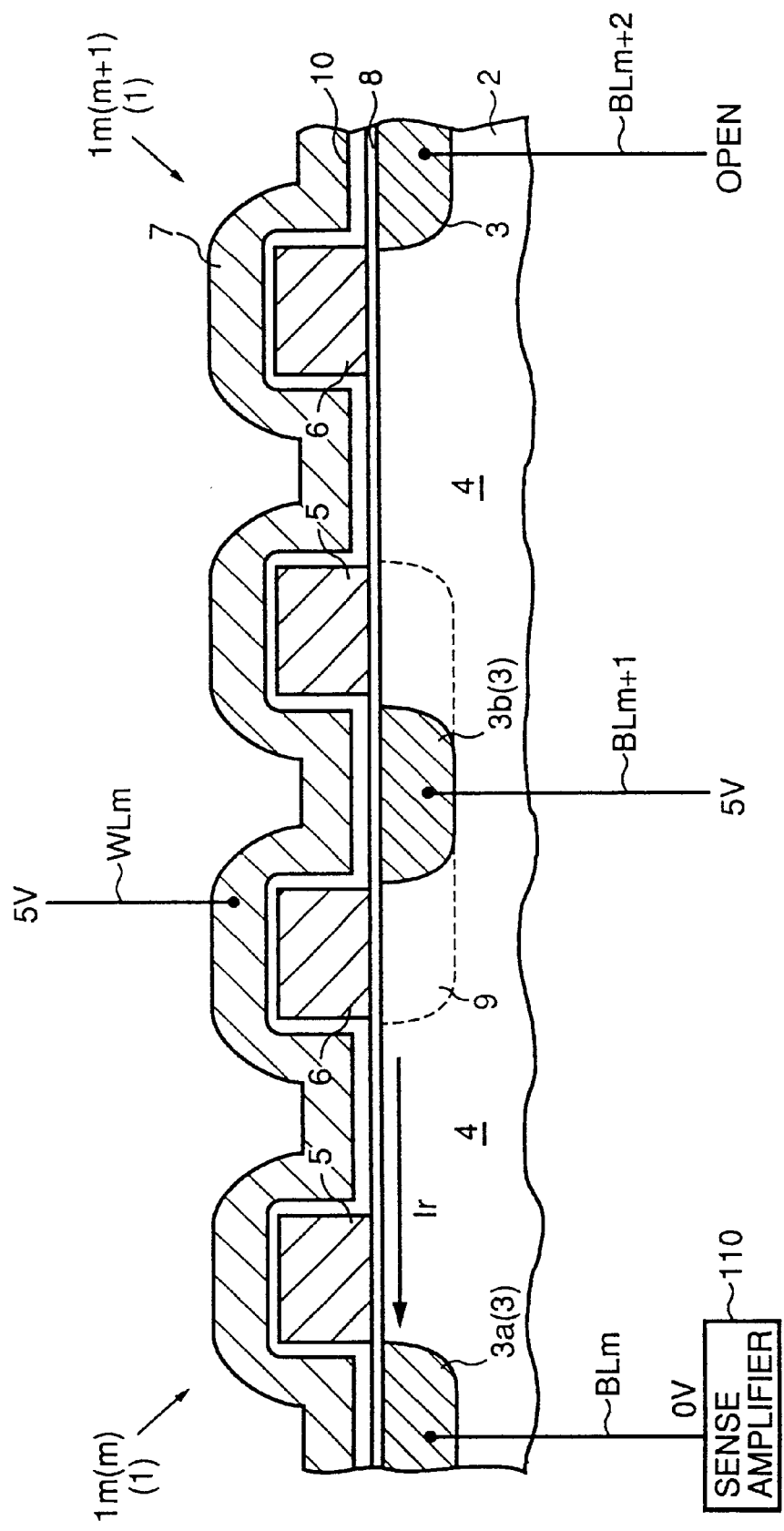
FIG. 5 is a cross sectional view of the main part for use in illustration of the function of the first embodiment.
Figure 6:
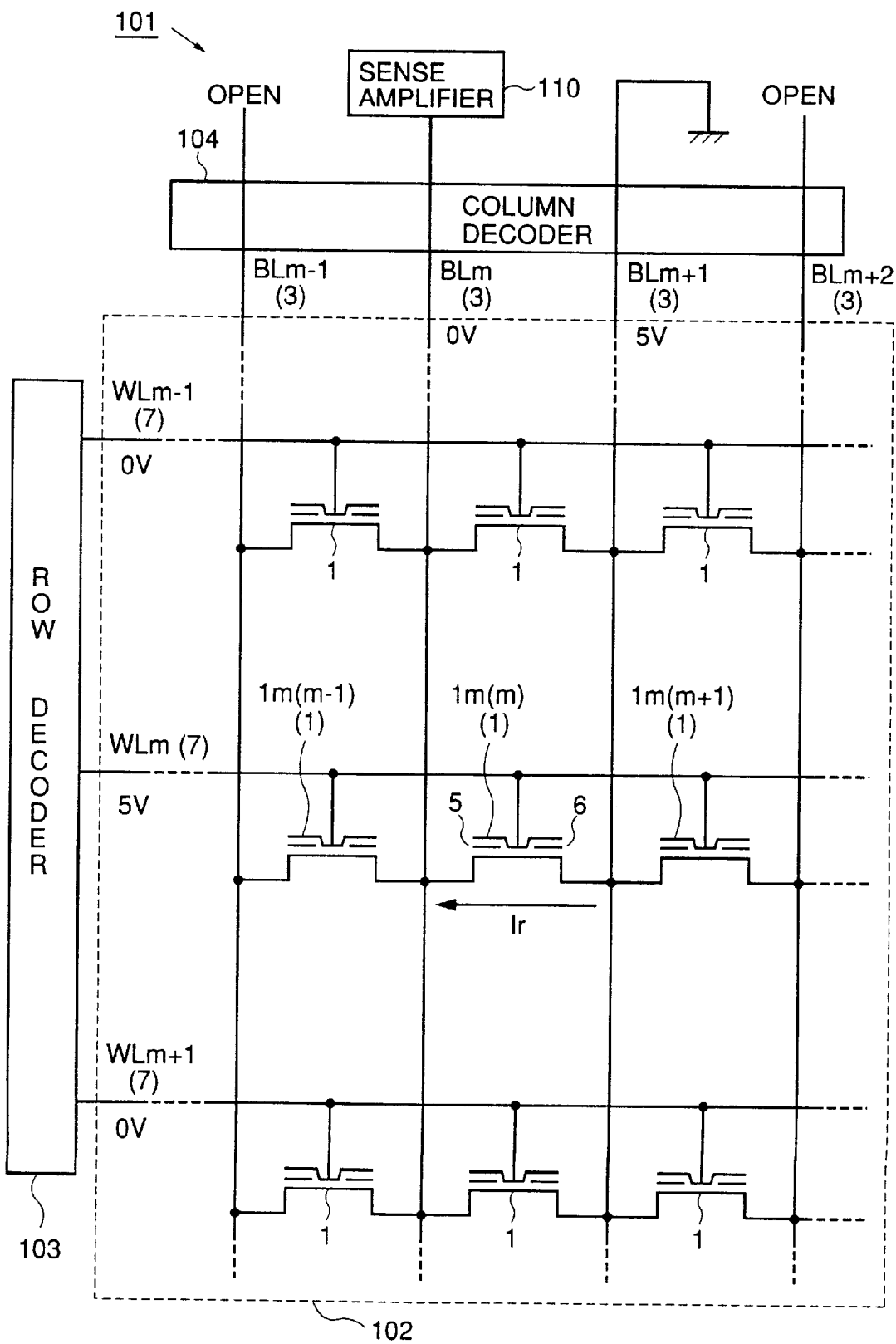
FIG. 6 is a circuit diagram of the main part for use in illustration of the function of the first embodiment.
Figure 7:
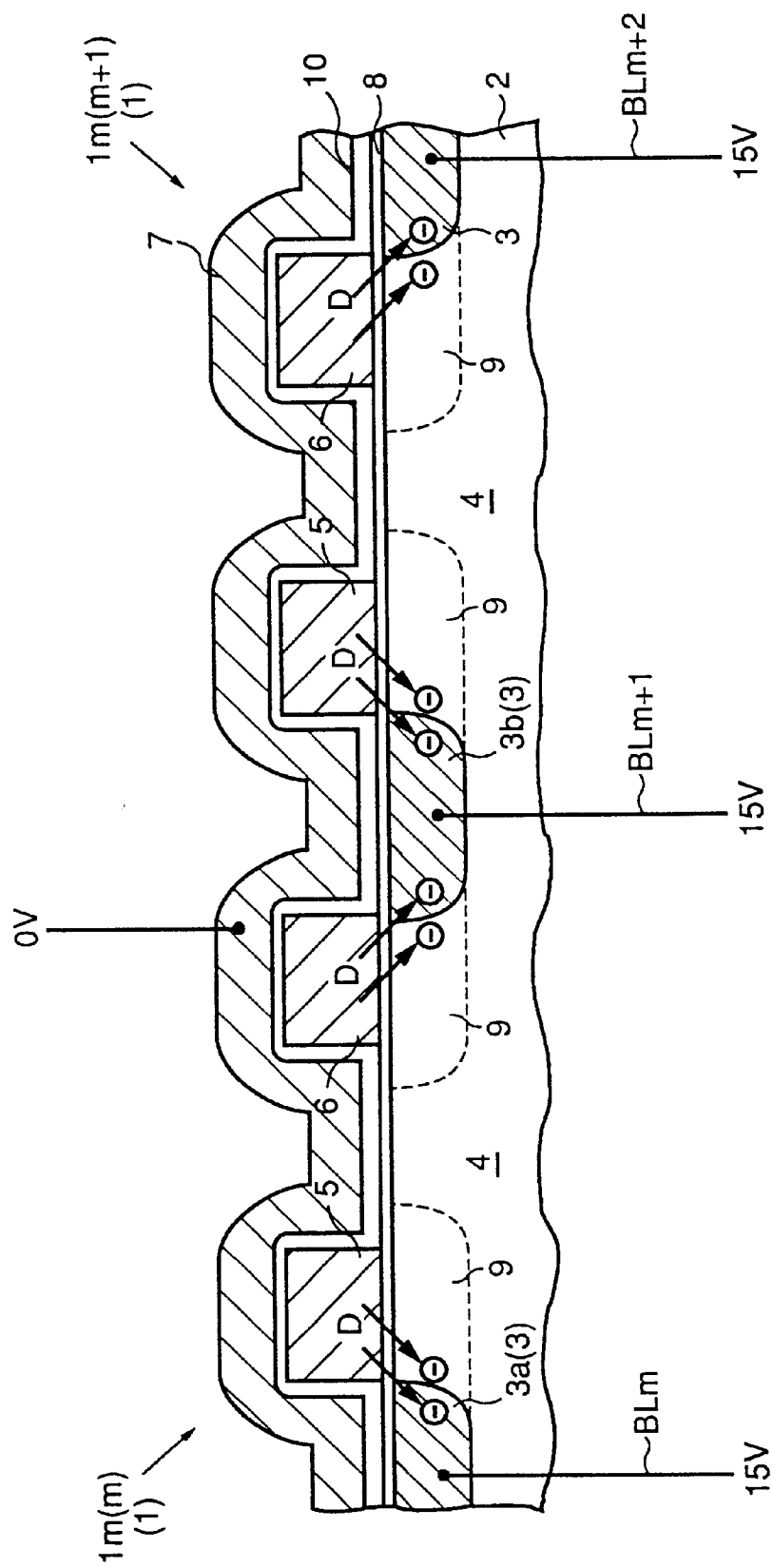
FIG. 7 is a cross sectional view of the main part for use in illustration of the function of the first embodiment.

Operation modes (writing, reading, erasure) of flash EEPROM 101 will be now described by referring to FIGS. 3 to 8. Note that FIGS. 3, 5 and 7 show only a main part of FIG. 1A, and FIGS. 4, 6 and 8 show only a main part of FIG. 2.

(a) Writing (FIGS. 3 and 4)

In the following description, memory cell 1 connected to the crossing of word line WLm and each of bit lines BLm and BLm+1 (hereinafter referred to as "1m(m)") is selected, and data is written in floating gate electrode 5 among floating gate electrodes 5 and 6 of memory cell 1m(m).

Bit line BLm corresponding to a source/drain region 3 closer to floating gate electrode 5 among source/drain regions 3 of memory cell 1m(m) (hereinafter referred to as "3a") is grounded through a constant current source 110a provided in sense amplifier 110, and the potential is set at 1.2 V.

Among source/drain regions of memory cell 1m(m), a source/drain region 3 closer to floating gate electrode 6 (hereinafter referred to as "3b") is set at 10 V.

The potential of each bit line corresponding to source/drain regions 3 of memory cells 1 other than selected memory cell 1m(m) (BL1, . . . , BLm−1, BLm+2, BLn) is set open.

The potential of word line WLm corresponding to the control gate electrode 7 of memory cell 1m(m) is set at 15 V. The potential of each word line (WL1, . . . , WLm−1, WLm+2, . . . , WLn) corresponding to the control gate 7 of each memory cell 1 other than the selected memory cell 1m(m) is set at 0 V.

Based on the above-described potential relation, a depletion layer 9 expands toward source/drain region 3a from source/drain region 3b. Depletion layer 9 reaches an end of floating gate electrode 6.

In memory cell 1m(m), the threshold voltage Vth of select transistor 12 is at about 0.5 V. As a result, in memory cell 1m(m), electrons in source/drain region 3a move into channel region 4 in an inverted state. Cell current Iw is therefore passed from source/drain region 3b toward source/drain region 3a. Since the potential of the control gate electrode is at 15 V, coupling between control gate electrode 7 and floating gate electrodes 5 and 6 through capacitance raises the potentials of floating gate electrodes 5 and 6 close to a level in the range from 10 V to 15 V.

At the time, since depletion layer 9 extends from source/drain electrode 3b, no high electric field is generated between channel region 4 and floating gate electrode 6. Meanwhile, since a high electric field is generated between channel region 4 and floating gate electrode 5, electrons in channel region 4 are accelerated to be hot electrons, and injected to floating gate electrode 5 as denoted by arrow C in FIG. 3. As a result, charge is stored at floating gate electrode 5 in memory cell 1m(m) and 1-bit data is written and stored.

Note that if data is written into the floating gate electrode 6 of memory cell 1m(m), bit line BLm+1 corresponding to source/drain region 3b is grounded through constant current source 110a provided in sense amplifier 110, and the potential of bit line BLm corresponding to source/drain region 3a is set at 10 V. The other potential conditions or the open state are the same as those in writing data to the floating gate electrode 5 of memory cell 1m(m).

The writing may be performed for each of floating gate electrodes 5 and 6 for a selected memory cell 1.

(b) Reading (FIGS. 5 and 6)

How data is read out from the floating gate electrode 5 of a selected memory cell 1m(m) will be now described.

The potential of bit line BLm corresponding to the source/drain region 3a of memory cell 1m(m) is set at 0 V.

The potential of bit line BLm+1 corresponding to the source/drain region 3b of memory cell 1m(m) is set at 5 V.

Bit lines (BL1, . . . , BLm−1, BLm+2, . . . , BLn) corresponding to the source/drain regions 3 of memory cells 1 other than selected memory cell 1m(m) are brought into an open state.

The potential of word line WLm corresponding to the control gate electrode 7 of memory cell 1m(m) is set at 5 V.

The potentials of word lines (WL1, . . . , WLm+1, WLm+2, . . . , WLn) corresponding to the control gate electrodes 7 of memory cells 1 other than selected memory cell 1m(m) are set at 0 V.

Based on the foregoing potential relation, depletion layer 9 extends from source/drain region 3b toward source/drain region 3a. Depletion layer 9 reaches an end of floating gate electrode 6.

In memory cell 1m(m), since depletion layer 9 extends from source/drain region 3b, cell current Ir passed from source/drain region 3b to source/drain region 3a is not affected by the presence/absence of charge stored at floating gate electrode 6.

As will be described, charge is not stored at floating gate electrode 5 in an erased state. In contrast, as described above, charge is stored at floating gate electrode 5 in a written state. As a result, channel region 4 immediately under floating gate electrode 5 in an erased state is an on state, while channel region 4 immediately under floating gate electrode 5 in a written state is almost in an off state.

As a result, cell current Ir passed from source/drain region 3b to source/drain region 3a in response to application of 5 V to control gate electrode 7 is larger for floating gate electrode 5 in an erased state than in a written state.

The value of cell current Ir is detected by sense amplifier 110, and the value of data stored at floating gate electrode 5 in memory cell 1m(m) may be read out. For example, a reading is performed by representing the value of data at floating gate electrode 5 in an erased state as "1", and the value of data at floating gate electrode 5 in a written state as "0". Note that cell current Ir may be detected by connecting sense amplifier 110 to the side of source/drain region 3b.

Note that if data is read out from the floating gate electrode 6 of memory cell 1m(m), the potential of bit line BLm+1 corresponding to source/drain region 3b is set at 0 V, and the potential of bit line BLm corresponding to source/drain region 3a is set at 5 V. The other potential conditions or open state are the same as those in reading data from the floating gate electrode 5 of memory cell 1m(m).

More specifically, for a selected memory cell 1m(m), each of the floating gate electrodes 5 and 6 stores either of two values (=1 bit) including the data value "1" in an erased state and the data value "0" in a written state, and the data values may be read out.

Figure 8:
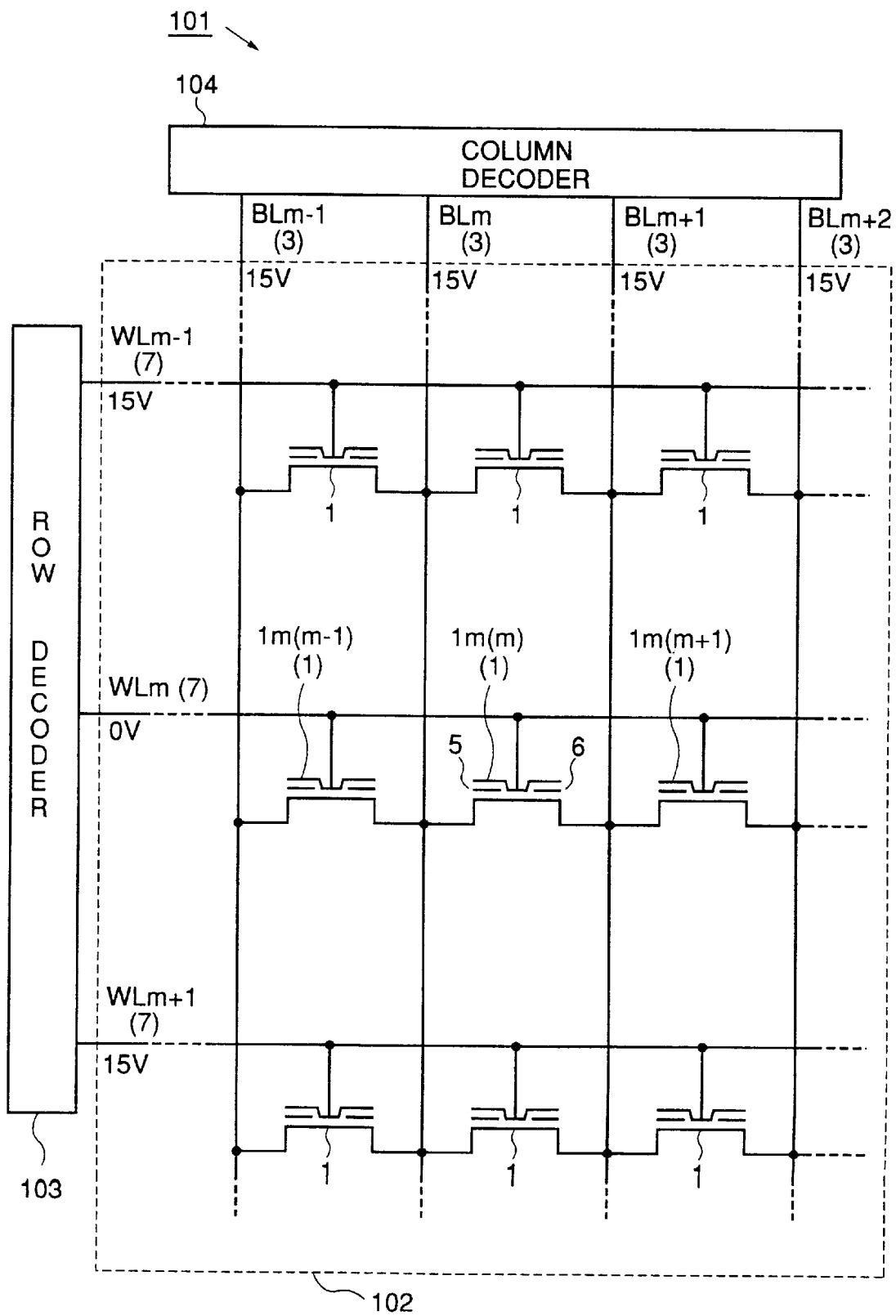
FIG. 8 is a circuit diagram of the main part for use in illustration of the function of the first embodiment.
Figure 9A:
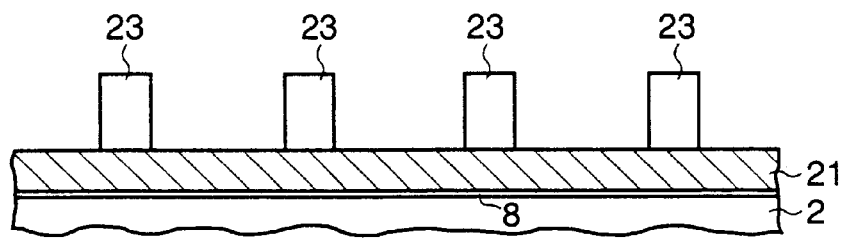
FIGS. 9A to 9G are cross sectional views of the main part for use in illustration of a method of manufacturing the device according to the first embodiment.
Figure 9B:
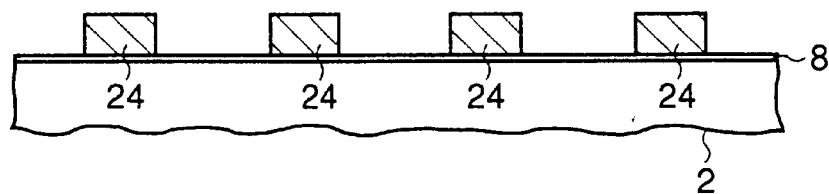
Figure 9C:
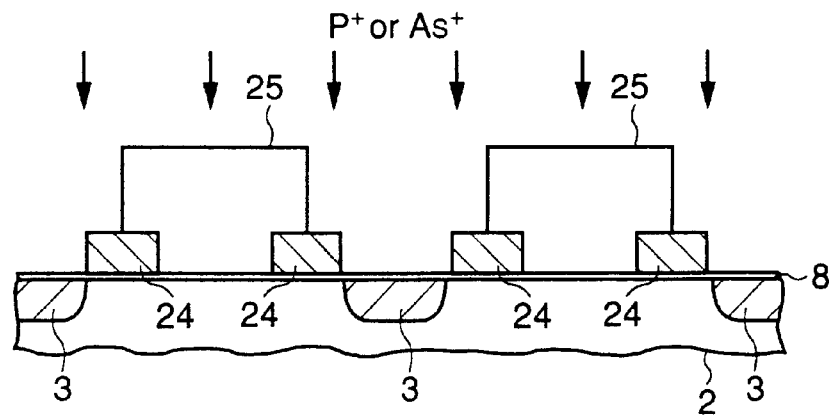
Figure 9D:
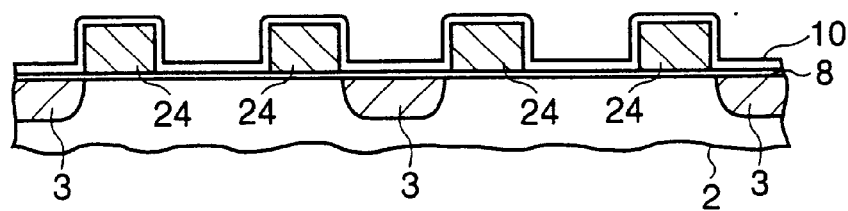
Figure 9E:
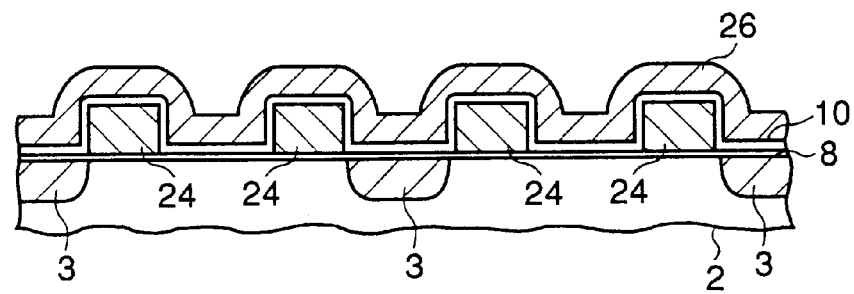
Figure 9F:
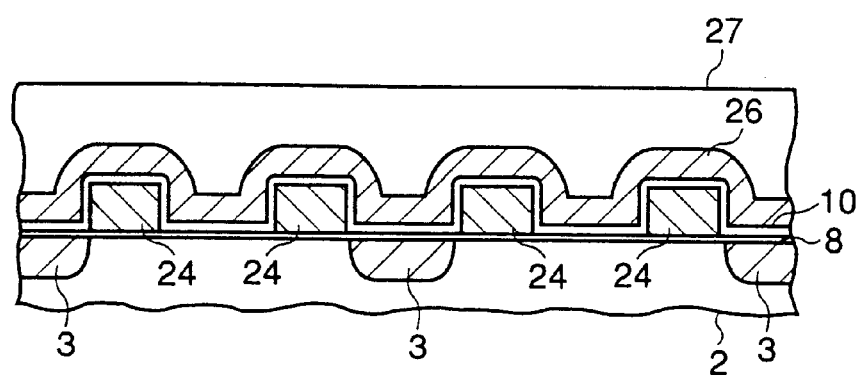
Figure 9G:
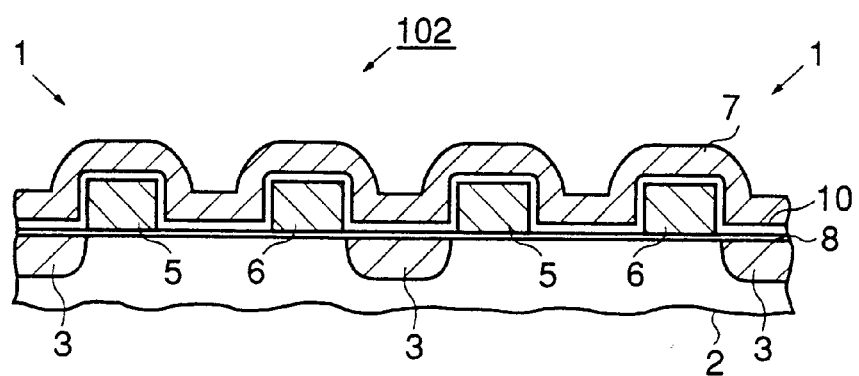

(c) Erasure (FIGS. 7 and 8)

How data stored at the floating gate electrodes 5 and 6 of all the memory cells connected to word line WLm is erased will be now described.

The potentials of all the bit lines BL1 to BLn are set at 15 V.

The potential of word line WLm is set at 0V. The potentials of word lines (WL1, . . . , WLm+1, WLm+2, WLn) are set at 15 V.

Based on the above potential relation, depletion layer 9 extends from source/drain region 3b toward source/drain region 3a or from source/drain region 3a toward source/drain region 3b.

As described above, capacitance C2 between substrate 2 (source/drain regions 3a, 3b and channel region 4) and each of floating gate electrodes 5 and 6 is smaller than capacitance C1 between control gate electrode 7 and each of floating gate electrodes 5 and 6. More specifically, each of floating gate electrodes 5 and 6 strongly couple control gate electrode 7. As a result, if control gate electrode 7 is set at 0 V, and source/drain regions 3a and 3b are set at 15 V, the potentials of floating gate electrodes 5 and 6 do not much change from 0 V, the potential difference between source/drain regions 3a and 3b and floating gate electrodes 5 and 6 become large, and a high electric field is generated between source/drain regions 3a, 3b and floating gate electrodes 5, 6.

As a result, FN tunnel current is passed, electrons in floating gate electrodes 5, 6 are pulled out to the side of source/drain regions 3a, 3b (depletion layer 9), and data stored at memory cell 1 is erased.

By selecting a plurality of word lines WL1 to WLn at a time, all the memory cells 1 connected to the word lines may be erased. Thus, the operation of erasing data on the basis of each of arbitrary blocks formed by dividing memory cell array 102 for each of a plurality of sets of word lines WL1 to WLn is called "block erasure".

A method of manufacturing memory cell array 102 will be now described one step after another in conjunction with FIGS. 9 to 12.

Step 1 (FIG. 9A): A field insulating film 13 is formed on a substrate 2 by means of LOCOS. Then, a gate insulating film 8 of a silicon oxide film is formed by means of thermal oxidation at a part of substrate 2 on which field insulating film 13 is not formed (element region). A doped polysilicon film 21 to be floating gate electrodes 5, 6 is formed on gate insulating film 8.

After applying photoresist on the entire surface of doped polysilicon film 21, a mask 23 for etching to form both sidewalls of floating gate electrodes 5 and 6 parallel to source/drain regions 3 is formed by means of a normal photolithography technique.

Step 2 (FIG. 9B): Using mask 23 for etching, doped polysilicon film 21 is anisotropically etched to form a films 24 to be floating gate electrodes 5, 6. These films 24 become floating gate electrodes 5, 6 continuously extending in parallel with source/drain regions 3.

Step 3 (FIG. 9C): After applying photoresist on the entire surface of the device formed by the process up to the above step, a mask 25 for ion implantation to form source/drain regions 3 is formed by means of a normal photolithography technique. N type impurity ions (phosphorous ions, arsenic ions are implanted into the surface of substrate 2 by means of normal ion implantation to form source/drain regions 3, followed by removal of mask 25.

At the time, mask 25 is formed to cover at least the part of substrate 2 on which source/drain region 3 is not formed and restricted on film 24. As a result, the positions of source/drain regions 3 are defined by sidewalls of film 24 (more specifically, by ends of floating gate electrodes 5 and 6).

Step 4 (FIG. 9D): A tunnel insulating film 10 of a silicon oxide film is formed on the entire surface of the device formed by the process up to the above step by means of thermal oxidation or LPCVD or by both. Then, insulating films 8 and 10 placed upon each other are integrated.

Step 5 (FIG. 9E): A doped polysilicon film 26 to be control gate electrode 7 is formed on the entire surface of the device formed by the process up to the above-step.

Methods of forming doped polysilicon films 21 and 26 will be listed below.

Method 1: Before forming a polysilicon film by means of LPCVD, a gas containing an impurity is mixed into a material gas.

Method 2: After forming a non-doped polysilicon film by means of LPCVD, a layer of impurity diffusion source (such as $POCL_3$) is formed on the polysilicon film, and the impurity is diffused in the polysilicon film from the impurity diffusion source layer.

Method 3: After forming a non-doped polysilicon film by means of LPCVD, impurity ions are implanted.

Step 6 (FIG. 9F): After applying photoresist on the entire surface of the device formed by the process up to the above step, a mask 27 for etching to form floating gate electrodes 5, 6 and control gate electrode 7 is formed by means of a normal photolithography technique.

Step 7 (FIG. 9A): Using a mask 27 for etching, doped polysilicon film 26, tunnel insulating film 10 and film 24 are anisotropically etched at a time while controlling an etching gas. Thus, control gate electrode 7 is formed from doped polysilicon film 26, and floating gate electrodes 5, 6 are formed from film 24.

After removal of mask 27, memory cell array 102 is completed.

As described in detail, according to the present embodiment, the following function and effects are brought about.

[1] Memory cell 1 has two floating gate electrodes 5 and 6, which are both provided on channel region 4 between two source/drain regions 3. Floating gate electrodes 5 and 6 share one control gate electrode 7.

One memory cell 1 is capable of storing 1-bit data for each of floating gate electrodes 5 and 6, in other words 2-bit data can be stored in total.

Accordingly, in the same design rule, the area occupied by memory cell 1 on substrate per 1 bit may be reduced to about 66% that of conventional memory cell 201.

[2] The control gate electrodes 7 of memory cells 1 arranged in the row-direction form common word lines WL1 to WLn. More specifically, the control gate electrodes 7 of memory cells 1 arranged in the row-direction are continued other than isolated.

As a result, the problem of (1) according to the conventional technique may be completely avoided.

[3] Based on the above [2], it is no longer necessary to take into consideration the precision of overlapping dimension of floating gate electrodes 5, 6 and control gate electrode 7, the problem (2) according to the conventional technique can be completely avoided.

[4] In step 7 according to this embodiment, doped polysilicon film 26, tunnel insulating film 10, and film 24 are etched at a time while controlling an etching gas to form control gate electrode 7 from doped polysilicon film 26 and floating gate electrodes 5, 6 from film 24.

[5] In memory cell array 102, the source/drain regions 3 of memory cells 1 arranged in the column-direction form common bit lines BL1 to BLn. As a result, in memory cell array 102, it is not necessary to form bit line contact 214 as in the conventional memory cell array 302.

[6] Based on the above [4], [5], memory cell array 102 according to this embodiment may be fabricated into a more simple structure and more easily than memory cell array 302 according to the conventional technique.

[7] Flash EEPROM 101 using memory cell 1 is provided with select transistor 12, and therefore individual memory cells 1 are capable of selecting themselves. More specifically, if charge is excessively pulled out from floating gate electrodes 5, 6 at the time of erasure, channel region 4 may be brought into an off state by select gate 12. Accordingly, if over-erasure is generated, the on/off state of memory cell 1 may be controlled by select transistor 12, and therefore over-erasure is no longer a problem. By select transistor 12 provided in memory cell 1, the on/off state of the memory cell itself may be selected.

[8] The length of channel region 4 of memory cell 1 is longer than that of channel region 205 of conventional memory cell 201. As a result, the breakdown voltage of channel region 4 is higher than the breakdown voltage of channel region 205. Hence, in a writing, data is less likely to be written into the floating gate electrodes 5, 6 of memory cells 1 other than a selected memory cell 1, and therefore the function and effect of the writing operation as described above may be secured.

[9] In a reading, if the value of cell current Ir in memory cell 1 is detected by sense amplifier 110, a multi-value storage technique may be applied. More specifically, in the multi-value storage technique, it is inevitable to precisely detect cell current at the time of reading. Taking advantage of the technique of detecting the cell current, the value of cell current Ir in memory cell 1 may be precisely detected at the time of reading.

Second Embodiment

A second embodiment of the present invention will be now described in conjunction with the accompanying drawings. Note that in this embodiment, the same elements as the first embodiment are denoted by the same reference characters, and the description thereof will be omitted.

Figure 10:
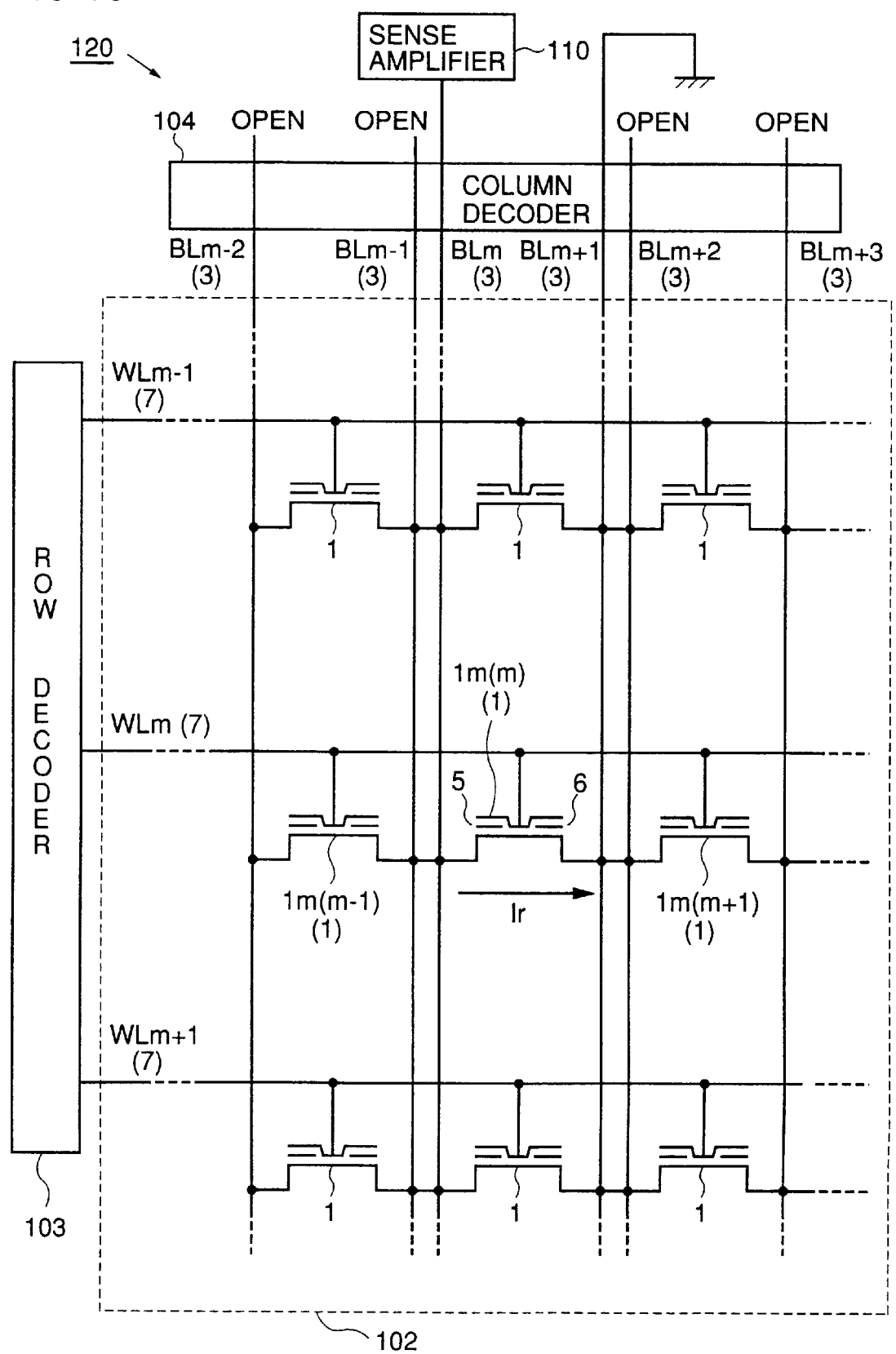
FIGS. 10 to 14 are circuit diagrams of main parts of second to sixth embodiments of the invention.

FIG. 10 shows the structure of a main part of flash EEPROM 120 according to this embodiment.

This embodiment is substantially identical to flash EEPROM 101 according to the first embodiment shown in FIG. 6 with the following differences.

1. In memory cell array 102, the source/drain regions 3 of each of memory cells 1 arranged in the row-direction are isolated from each other.

2. The source/drain regions 3 of each of memory cells 1 arranged in the column-direction form bit lines BL1 to BLn independent for each of memory cells 1 arranged in the row-direction.

More specifically, bit line BLm connected to memory cell 1m(m) is isolated from bit line BLm−1 connected to memory cell 1m(m−1). Bit line BLm+1 connected to memory cell 1m(m) is isolated from bit line BLm+2 connected to memory cell 1m(m+1).

According to this embodiment, the following function and effects are available in addition to the function and effects according to the first embodiment.

In the first embodiment, in a reading, if bit lines (BL1, . . . , BLm−1, BLm+2, . . . , BLn) corresponding to the source/drain regions 3 of memory cells 1 other than a selected memory cell 1m(m) are brought into an open state, charging/discharging current is passed across the bit lines. Therefore, until the bit lines are completely charged/discharged, the value of cell current Ir of memory cell 1m(m) cannot be surely detected by sense amplifier 110. More specifically, the rate of reading is lowered slightly, by the amount of time corresponding to the time for charging/discharging the bit lines brought into an open state.

In contrast, according to this embodiment, bit lines BL1 to BLn independent for each of memory cells 1 arranged in the row-direction are provided. As a result, in a reading, if bit lines (BL1, . . . , BLm−1, BLm+2, . . . , BLn) corresponding to the source/drain regions 3 of memory cells 1 other than selected memory cell 1m(m) are brought into an open state, charging/discharging current will not passed across the bit lines.

Accordingly, in this embodiment, the lowering of the rate of reading caused by charging/discharging current for bit lines BL1 to BLn as in the first embodiment may be prevented, and a high speed reading may be implemented.

Also in this embodiment, since bit lines BL1 to BLn independent for each of memory cells 1 arranged in the row-direction are provided, an erasure may be performed for each selected memory cell 1.

Third Embodiment

A third embodiment of the invention will be now described in conjunction with the accompanying drawings. Note that in this embodiment, the same elements as those in the second embodiment are denoted by the same reference characters, and the description will be omitted.

Figure 11:
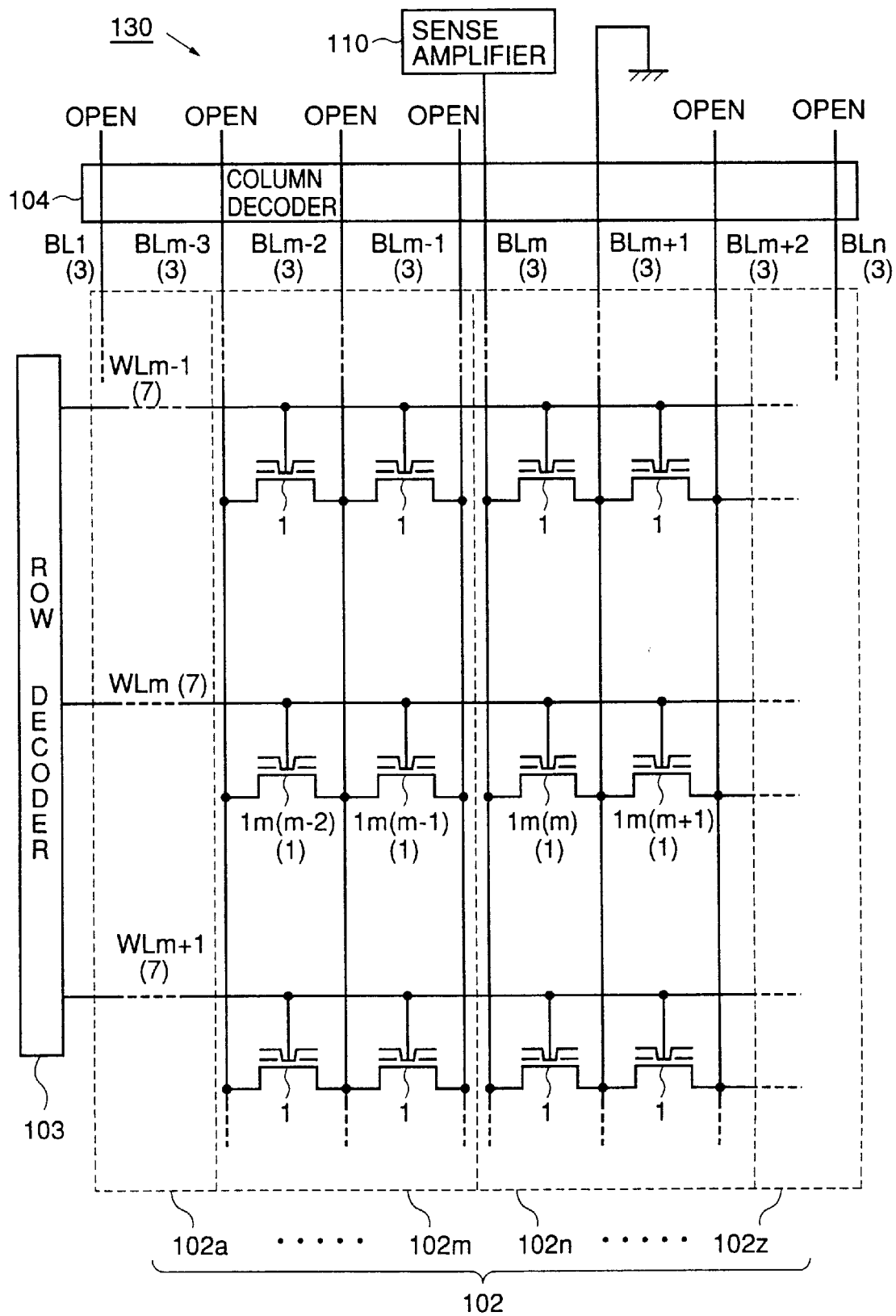

FIG. 11 shows a main part of flash EEPROM 130 according to this embodiment.

This embodiment is substantially identical to flash EEPROM 120 according to the second embodiment with the following differences.

(1) Memory cell array 102 is divided into a plurality of cell blocks 102a to 102z in the row-direction and corresponding to bit lines BL1 to BLn. More specifically, cell block 102m includes memory cells 1 connected to bit lines BLm−3 to BLm−1. Cell block 102n includes memory cells 1 connected to bit lines BLm to BLm+2. More specifically, cell blocks 102a to 102z each have three bit lines BL1 to BLn.

(2) The source/drain regions 3 of memory cells 1 arranged in the column-direction form a common bit line.

(3) The source/drain regions 3 of memory cells 1 arranged in the row-direction are isolated from each other in separate cell blocks 102a to 102z. Between adjacent cell blocks among blocks 102a to 102z, the source/drain regions 3 of memory cells 1 arranged in the column-direction are isolated from each other to form independent bit lines. As a result, in each of cell blocks 102m and 102n, source/drain regions 3 corresponding to independent bit lines BLm−1 and BLm are isolated from each other.

More specifically, memory cells 1m(m) and 1m(m+1) are connected to common bit line BLm+1, and memory cells 1m(m−2) and 1m(m−1) are connected to common bit lines BLm−1. Bit line BLm connected to memory cell 1m(m) is isolated from bit line BLm−1 connected to memory cell 1m(m−1).

The embodiment as described above can bring about the following function and effect in addition to the function and effect brought about by the first embodiment.

In the second embodiment, while the speed of reading is increased, the area occupied by memory cell array 102 is large, because source/drain region 3 is formed corresponding to a bit line independent for each of memory cells 1 arranged in the row-direction in the entire memory cell array 102.

By contrast, in this embodiment, the source/drain regions 3 of memory cells 1 arranged in the column-direction are isolated to form separate bit lines in adjacent cell blocks among blocks 102a to 102z. More specifically, in each of cell blocks 102a to 102z, as is the case with the first embodiment, the source/drain regions 3 of memory cells 1 arranged in the column-direction form source/drain region 3 corresponding to a common bit line. As a result, in this embodiment, the area of memory cell array 102 may be smaller than that in the second embodiment.

Note, however, that in this embodiment, charging/discharging current is passed to bit line BLm+2 connected to memory cell 1m(m+1) next to selected memory cell 1m(m). The charging/discharging current is however not passed to the other bit lines (BL1, . . . , BLm−1, BLm+1, . . . , BLn), and therefore a reading at a higher speed than the first embodiment is enabled.

Also in this embodiment, an erasure may be performed only for all the memory cells 1 in a selected arbitrary one of cell blocks 102a to 102z among memory cells 1 connected to a selected one of word lines WL1 to WLn. For example, data in memory cells 1m(m−2) and 1m(m−1) in cell block 102m is erased, while data in the other memory cells 1 connected to the same word line WLm may be un-erased. Similarly, data in memory cells 1m(m−2), 1m(m−1), 1m(m), and 1m(m+1) in cell blocks 102m and 102n may be erased, while the other memory cells 1 connected to the same word line WLn may un-erased.

Fourth Embodiment

A fourth embodiment of the invention will be now described in conjunction with the accompanying drawings. Note that in this embodiment, the same elements as those in the first embodiment are denoted by the same reference characters, and the description will be omitted.

Figure 12:
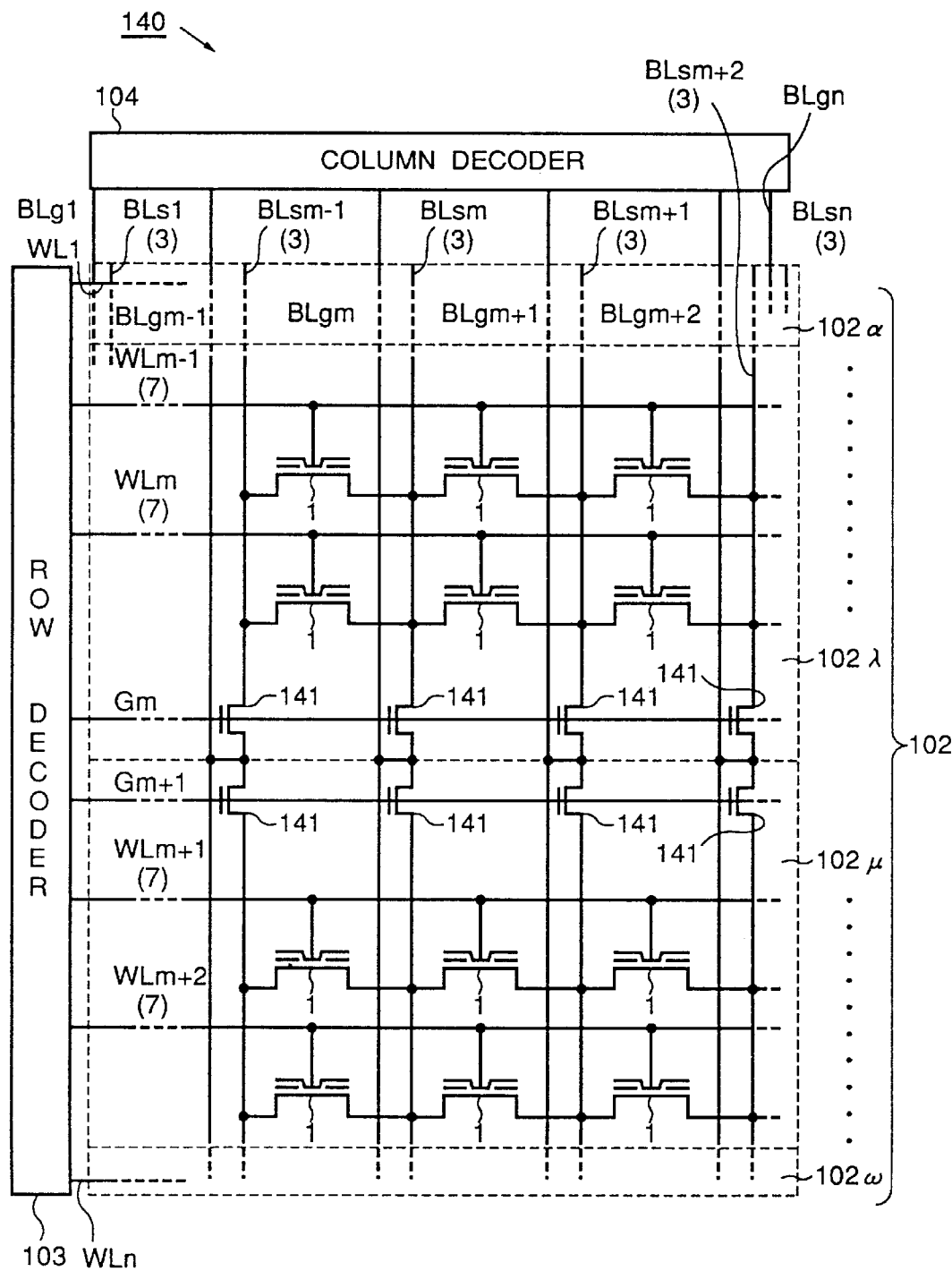

FIG. 12 shows the configuration of a main part of flash EEPROM 140 in this embodiment. This embodiment is substantially identical to flash EEPROM 101 according to the first embodiment shown in FIG. 6 with the following differences.

(1) Memory cell array 102 is divided into a plurality of cell blocks 102α to 102ω. Cell block 102λ includes memory cells 1 connected to word lines WLm−1 and WLm. Cell block 102μ includes memory cells 1 connected to word lines WLm+1 and WLm+2.

(2) The source/drain regions 3 of memory cells 1 arranged in the column-direction in cell blocks 102α to 102ω form common local short bit lines BLs1 to BLsn.

(3) Global bit lines BLg1 to BLgn are provided parallel to local short bit lines BLs1 to BLsn. Global bit lines BLg1 to BLgn are formed of interconnection layers of various metals including refractory metals.

(4) In cell blocks 102α to 102ω, local short bit lines BLs1 to BLsn are connected to global bit lines BLg1 to BLgn, respectively through MOS transistors 141. In cell blocks 102α to 102ω, the gates of MOS transistors 141 provided for local short bit lines BLs1 to BLsn are connected to common gate lines G1 to Gn, respectively.

More specifically, in cell block 102λ, the gates of MOS transistors 141 provided for local short bit lines BLs1 to BLsn are connected to common gate line Gm. In cell block 102μ, the gates of MOS transistors 141 provided for local short bit lines BLs1 to BLsn are connected to common gate line Gm+1.

(5) Gate lines G1 to Gn are connected to row decoder 103. When any of word lines WL1 to WLn in an arbitrary one of cell blocks 102α to 102ω is selected, row decoder 103 selects a corresponding one of gate lines G1 to Gn to the selected one of cell blocks 102α to 102ω. As a result, MOS transistor 141 connected to the selected one of gate lines G1 to Gn is turned on, and a corresponding one of local bit lines BLs1 to BLsn and a corresponding one of global bit lines BLg1 to BLgn are connected.

More specifically, if one of word lines in cell block 102λ is selected, gate line Gm is selected. If one of word lines in cell block 102μ is selected, gate line Gm+1 is selected.

In the embodiment as described above, local short bit lines BLs1 to BLsn formed by the source/drain regions 3 of memory cells 1 are provided independently in each of cell blocks 102α to 102ω. As a result, the length of local short bit lines BLs1 to BLsn is smaller than the length of bit lines BL1 to BLn according to the first embodiment. Local short bit lines BLs1 to BLsn are supported by global bit lines BLg1 to BLgn formed of metal interconnection layers.

As a result, the capacitance of local short bit lines BLs1 to BLsn is reduced, and time required for charging/discharging local short bit lines BLs1 to BLsn is reduced, which increases the speed of reading.

Note that the embodiments described above may be modified as follows, and the same function and effect may be provided in the modified forms.

(1) In the third embodiment, the number of bit lines BL1 to BLn included in cell blocks 102a to 102z is set to 4 or more.

Figure 13:
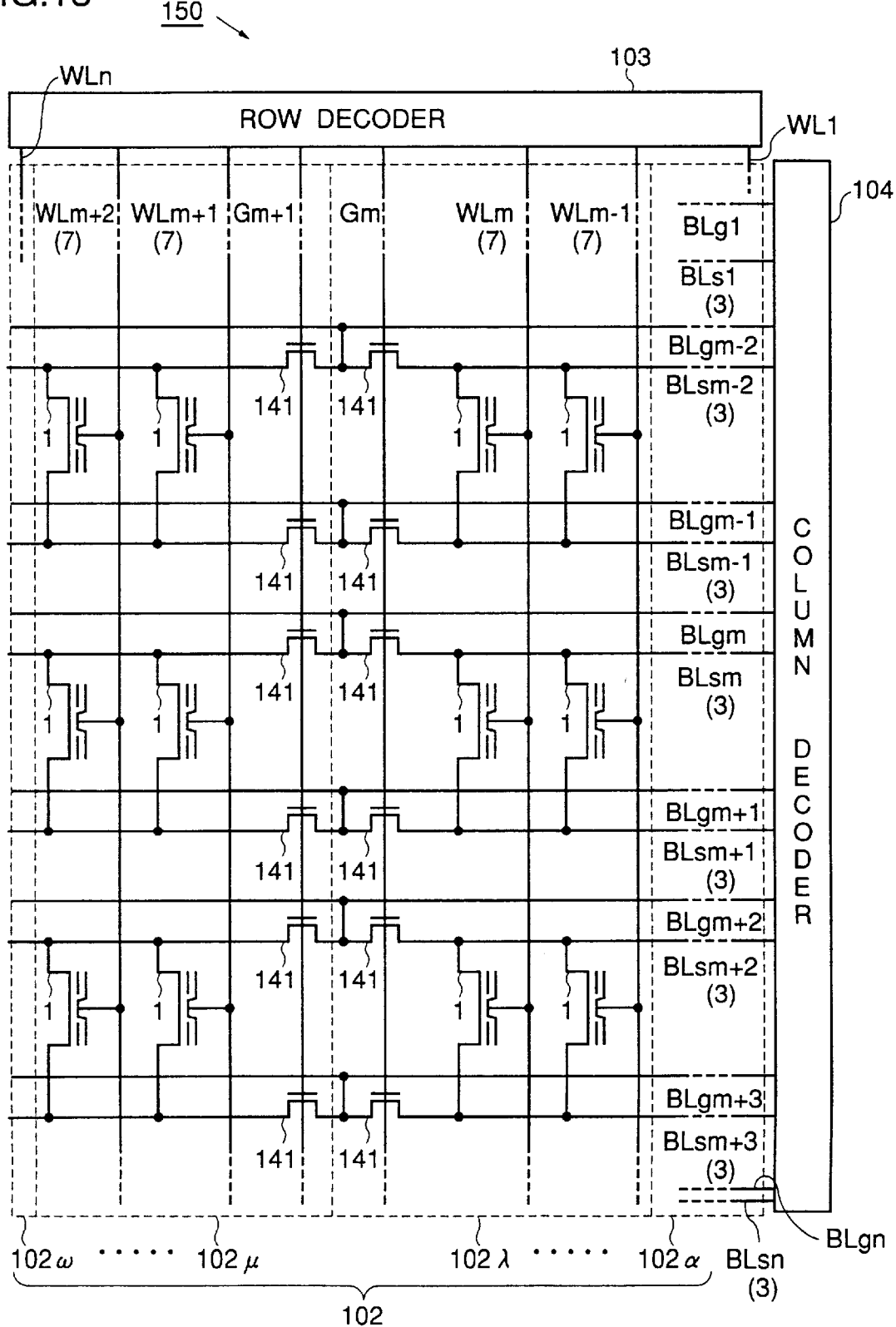

(2) A combination of the second and fourth embodiments is implemented as a fifth embodiment. The configuration of a main part of flash EEPROM 150 formed according to the combination is shown in FIG. 13. As an enhanced function brought about by combining the embodiments, the speed of reading may be further increased.

Figure 14:
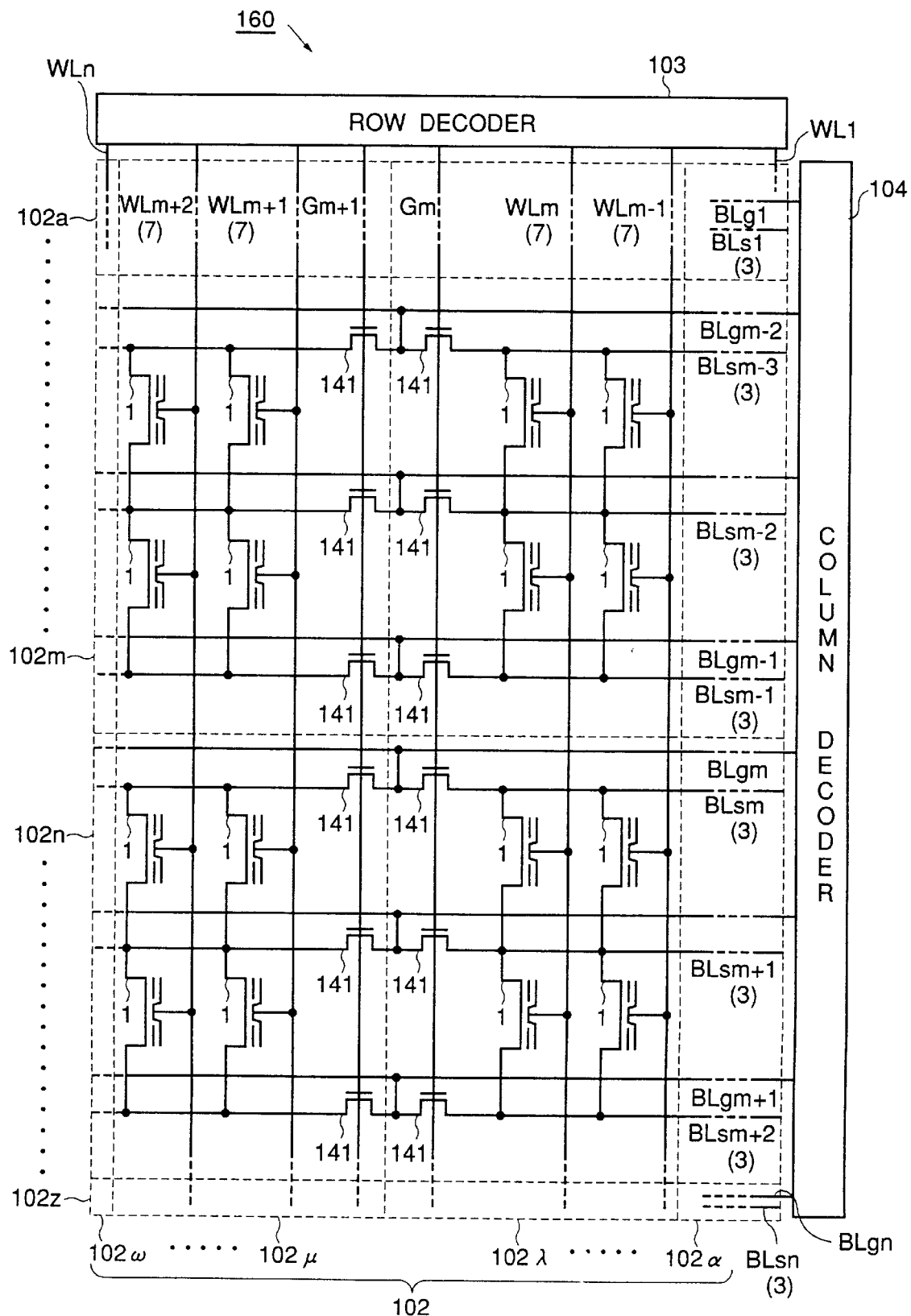
Figure 15:
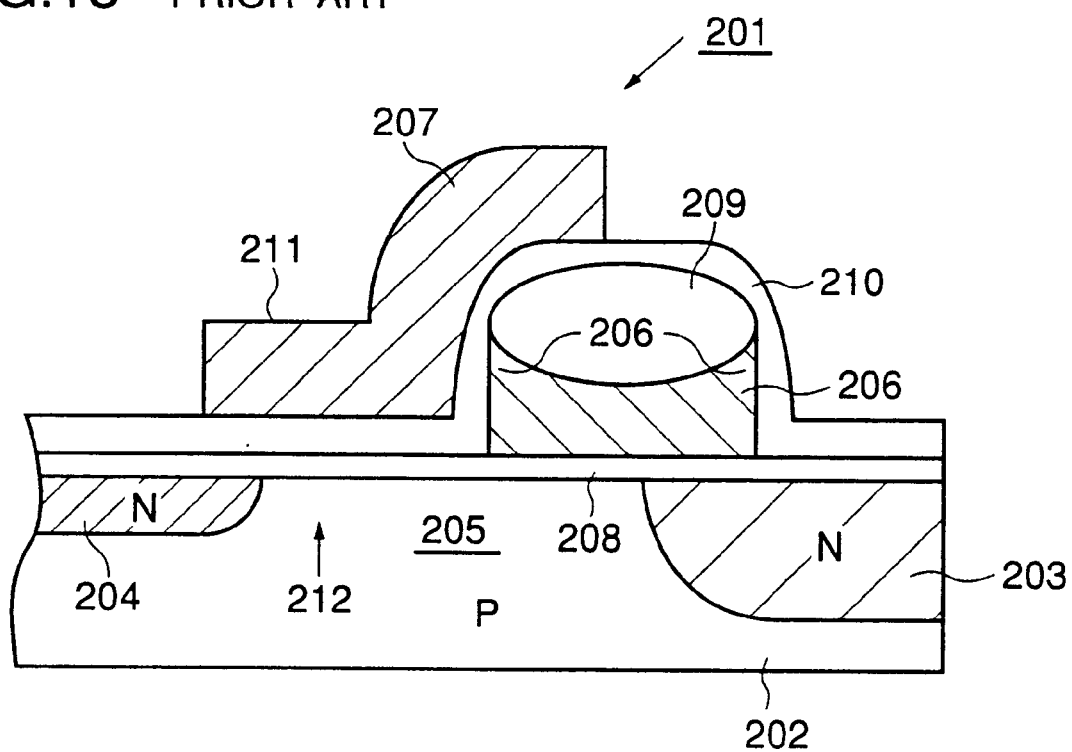
FIG. 15 is a schematic cross sectional view of a conventional device.
Figure 17:
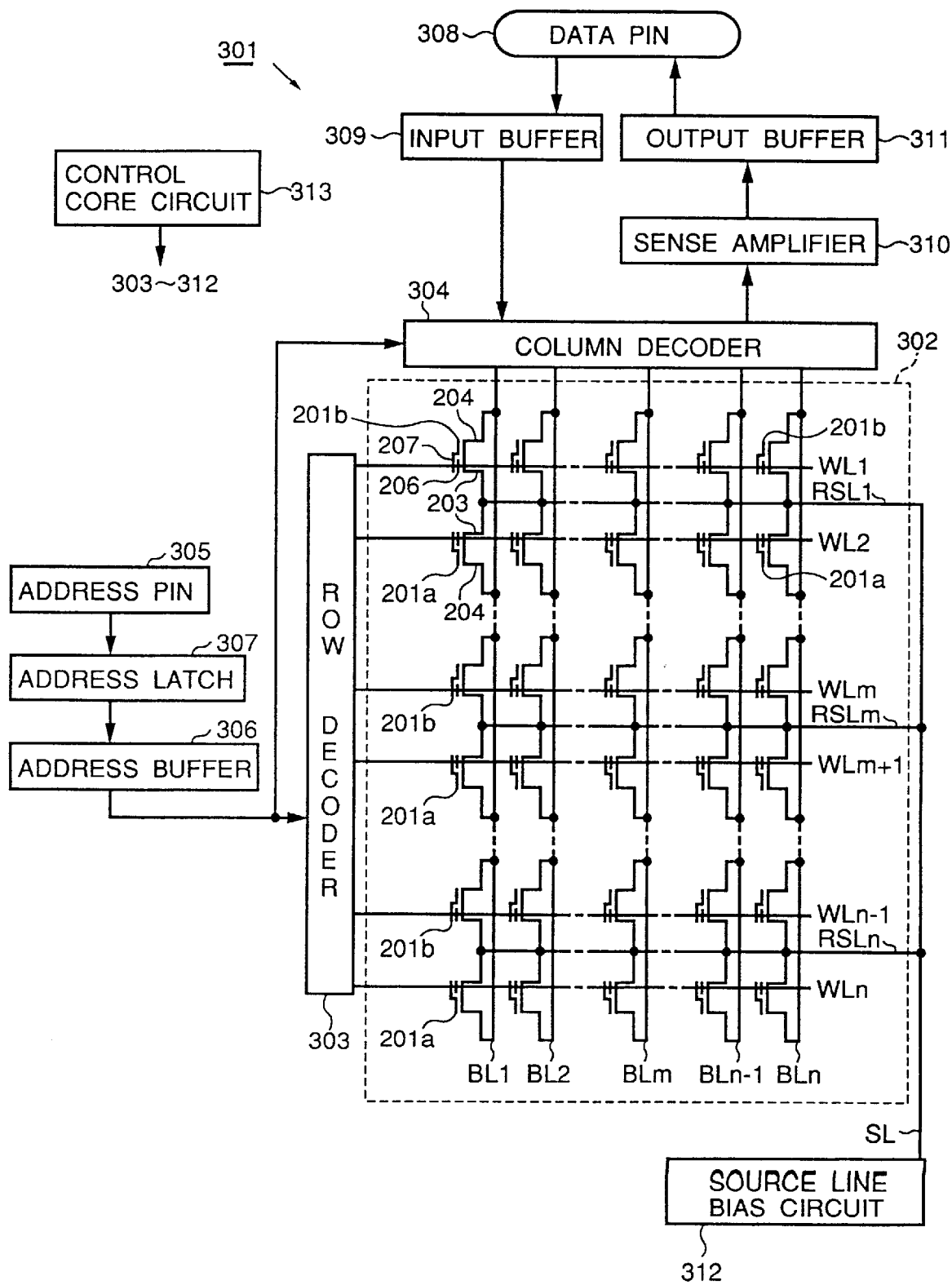
FIG. 17 is a circuit diagram of the conventional device.
Figure 18A:
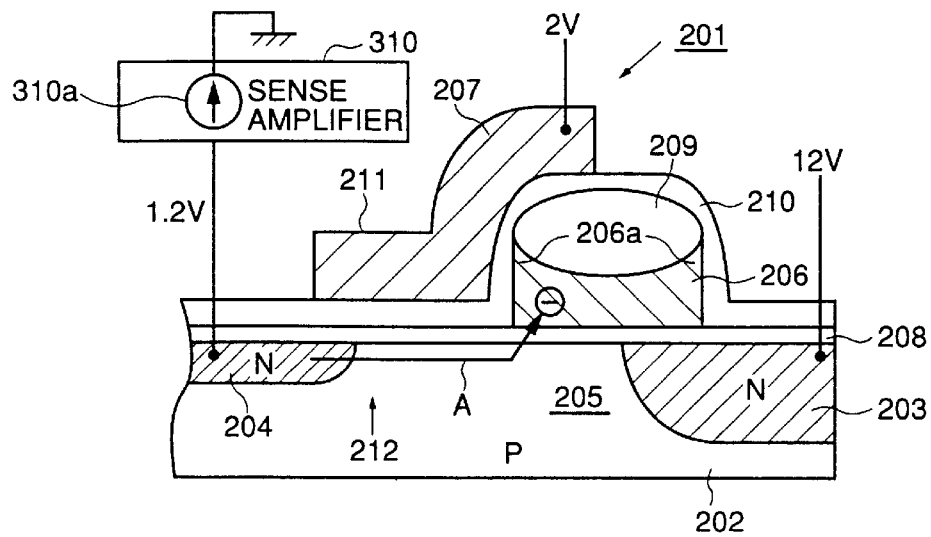
FIGS. 18A to 18C are cross sectional views of a main part for use in illustration of the function of the conventional device.
Figure 18B:
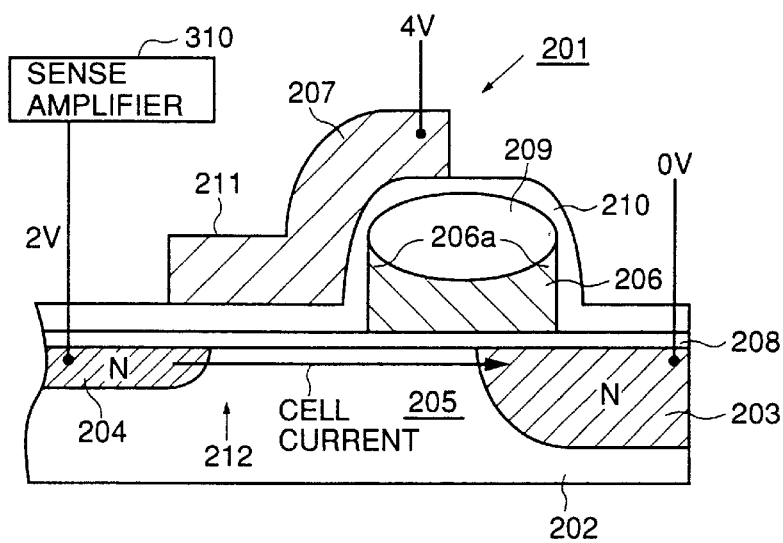
Figure 18C:
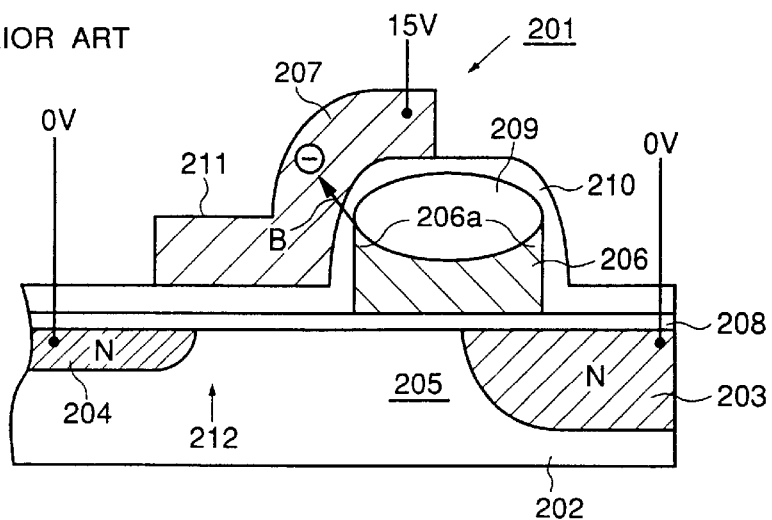
Figure 19A:
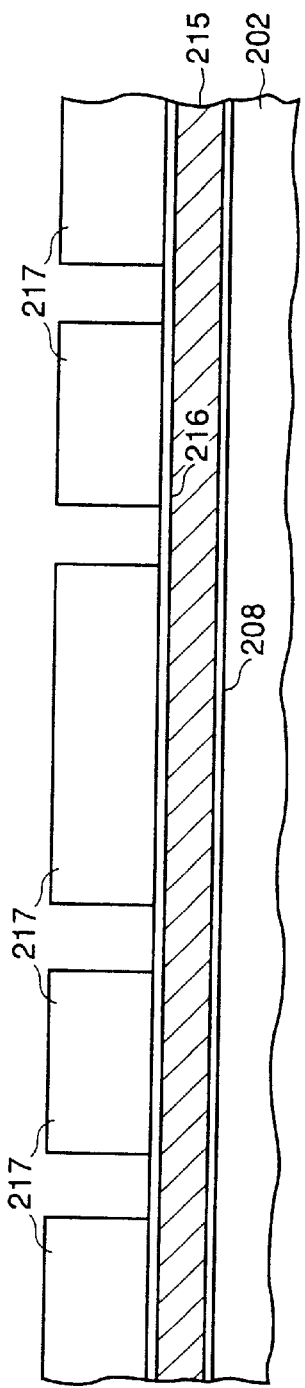
FIGS. 19A to 19I are cross sectional views of the main part of the conventional device for use in illustration of a manufacturing method thereof.
Figure 19B:
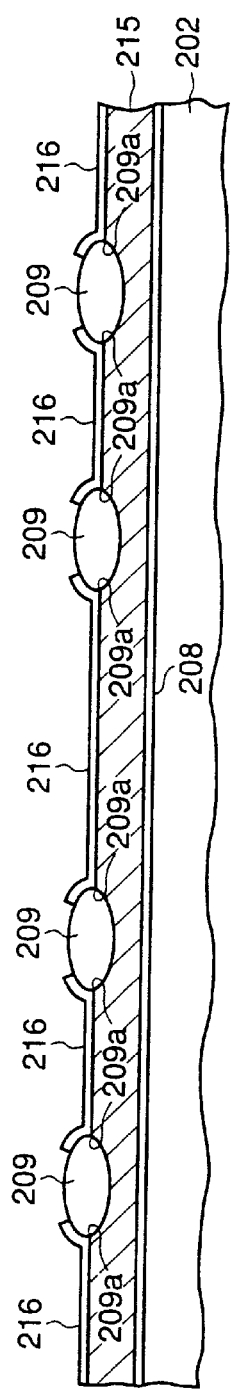
Figure 19C:
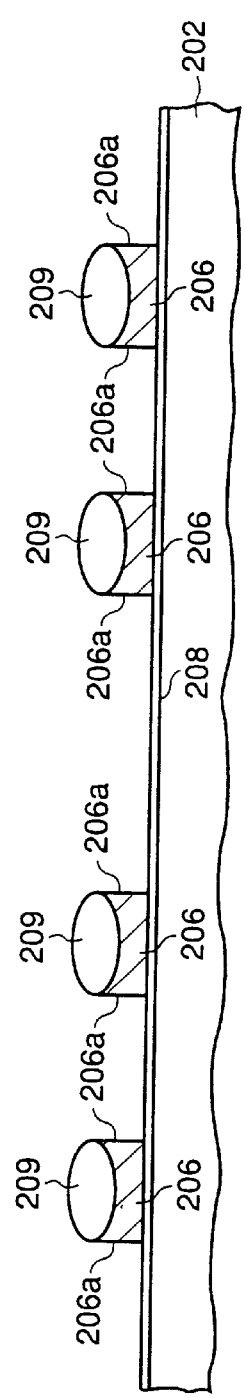
Figure 19D:
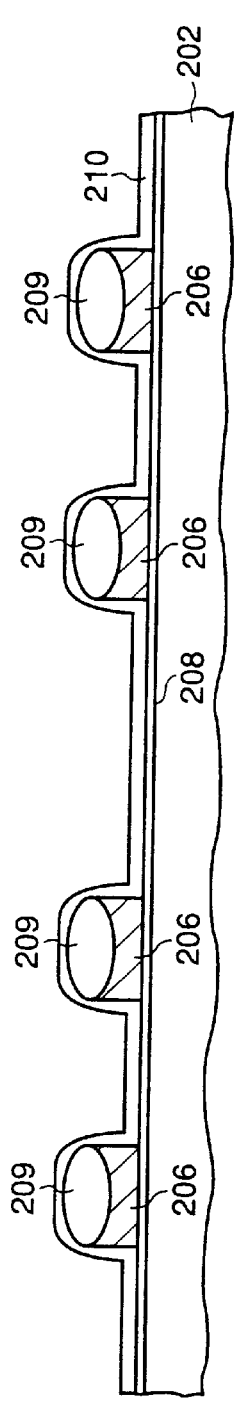
Figure 19E:
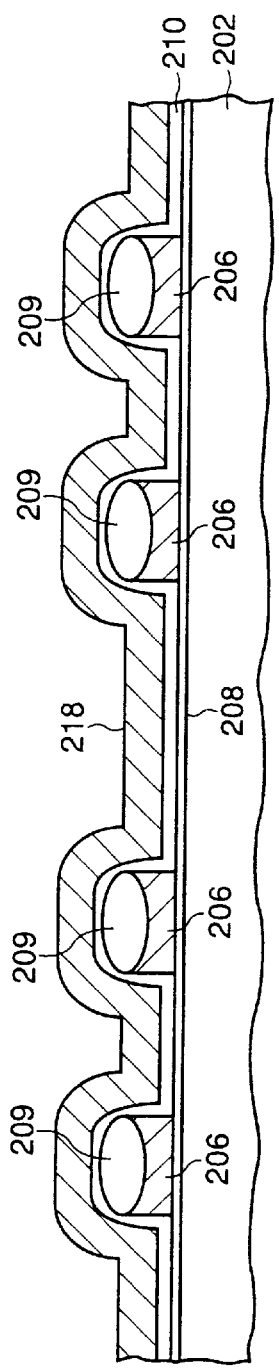
Figure 19F:
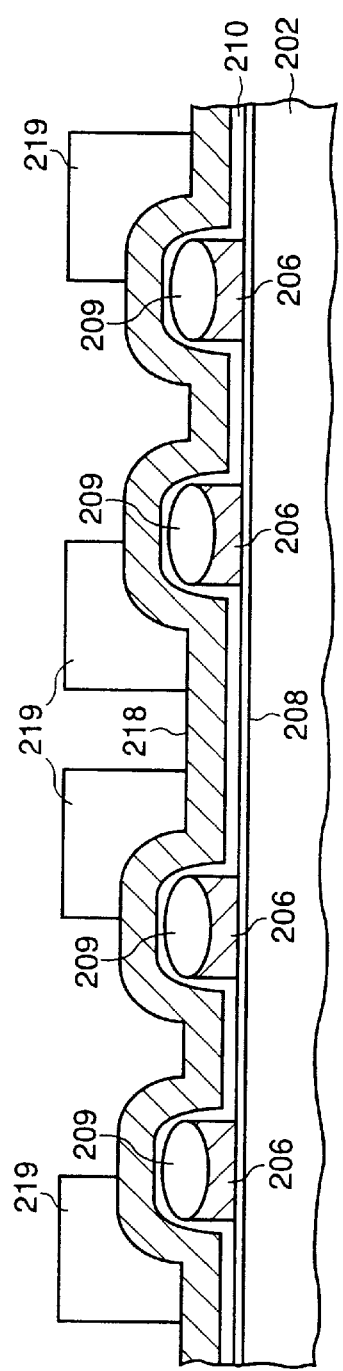
Figure 19G:
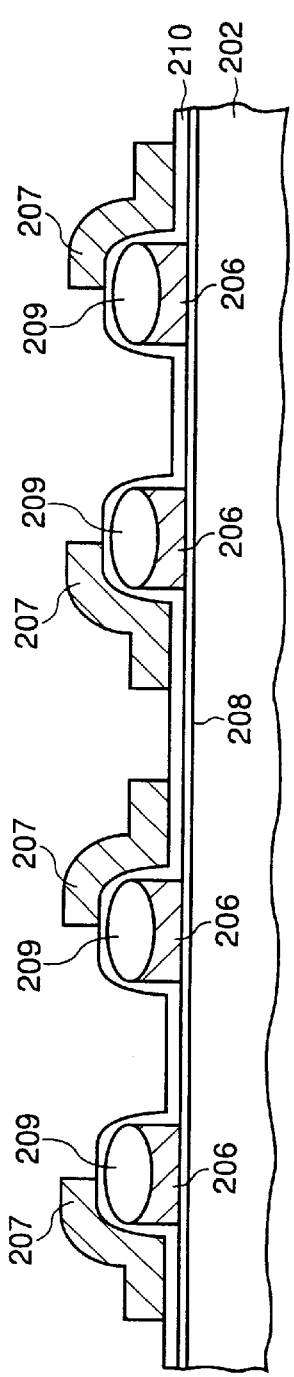
Figure 19H:
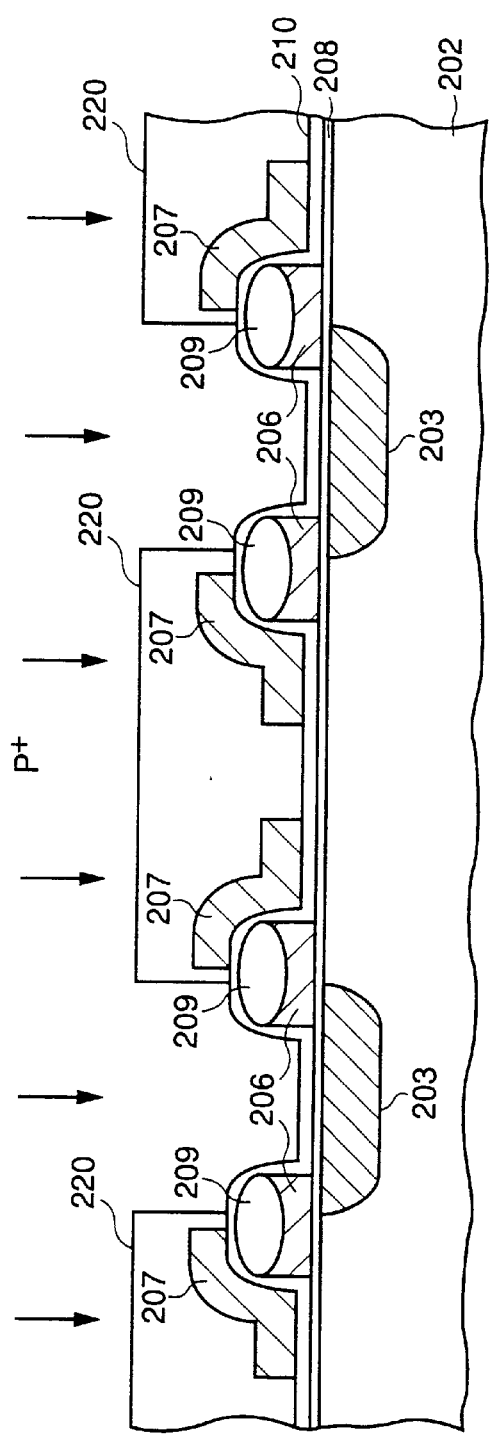
Figure 19I:
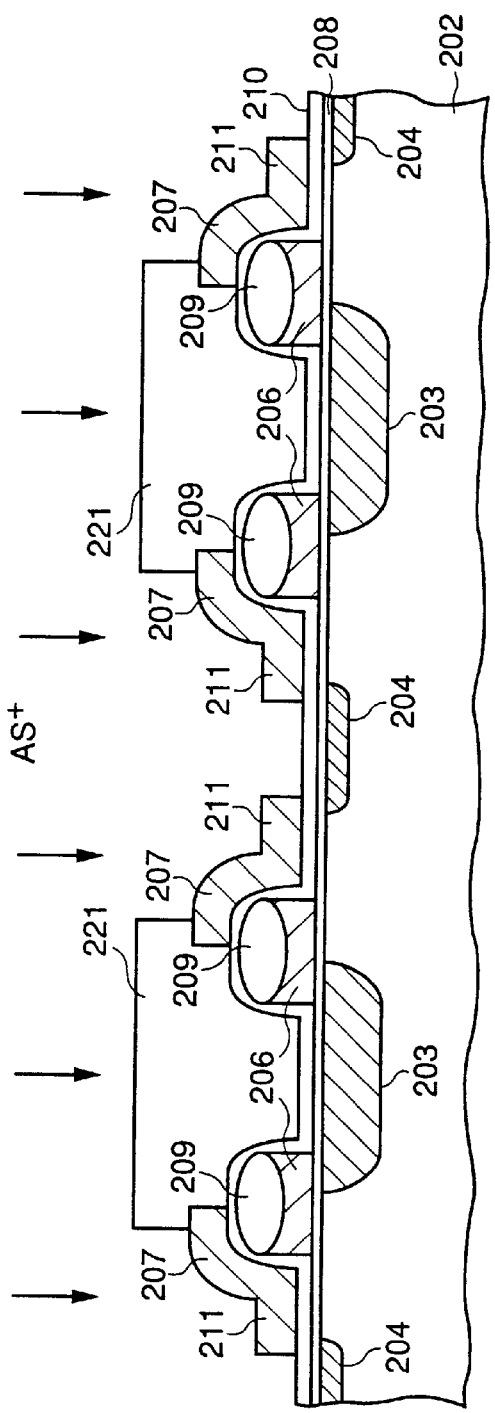
Figure 20A:
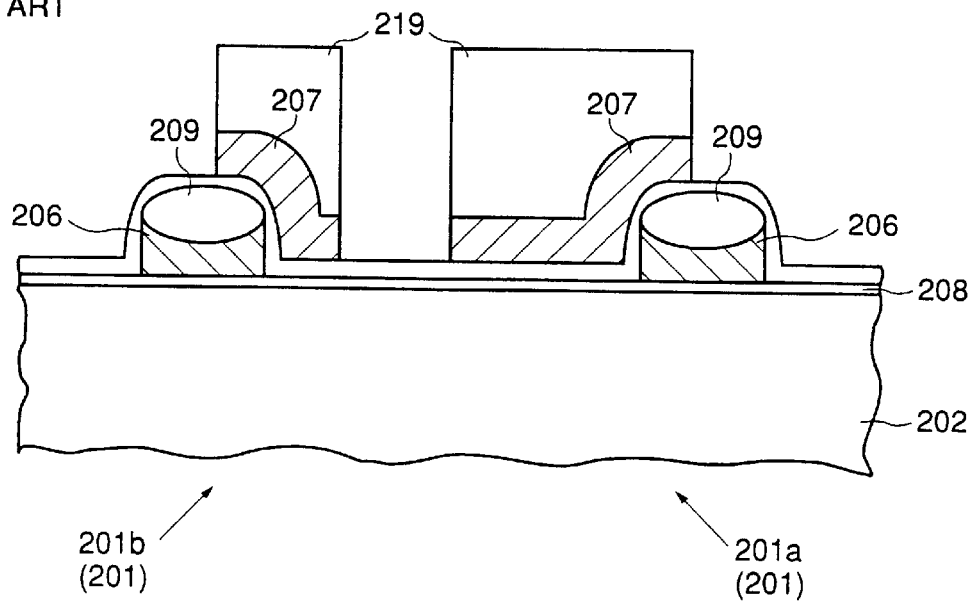
FIGS. 20A and 20B are cross sectional views of the main part for use in illustration of the function of the conventional device.
Figure 20B:
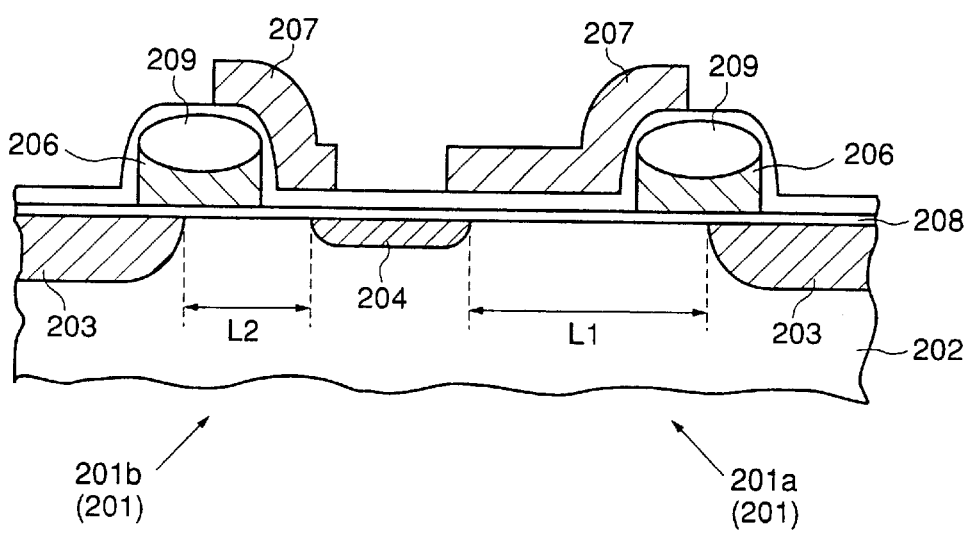

(3) The third embodiment and fourth embodiment are combined as a sixth embodiment. The configuration of a main part of flash EEPROM 160 is shown in FIG. 14. As an enhanced function by combining the embodiments, the speed of reading may be further increased.

(4) Insulating films 8 and 10 may be replaced with other insulating films containing, as a main constituent, at least one of silicon oxide, silicon oxynitride, and silicon nitride. At least one of thermal oxidation, thermal nitridation, thermal oxy-nitridation and CVD may be employed for forming such insulating films. A plurality of layers of different insulating films formed as above may be replaced for insulating films 8 and 10.

(5) The material of gate electrodes 5 to 7 may be replaced with a conductive material other than doped polysilicon (such as amorphous silicon, monocrystalline silicon, various metals including refractory metals, and metal silicide).

(6) P type monocrystalline silicon substrate 2 may be replaced with a P type well.

(7) P type monocrystalline silicon substrate 2 may be replaced with an N type monocrystalline silicon substrate or an N well, and P type impurity ions (such as boron and indium) are used as impurity ions to be implanted to form source/drain regions 3.

(8) The material of global bit lines BLg1 to BLgn may be replaced with a conductive material other than metal (such as doped polysilicon, and metal silicide).

(9) Using a multi-value storage technique, data of three or more values is stored for each of the floating gate electrodes 5, 6 of memory cell 1.

(10) In each of the embodiments, a verify writing method may be employed at the time of writing.

Note that in this specification, the elements of the device according to the invention are defined as follows.

(a) The semiconductor substrate includes, in addition to the monocrystalline silicon semiconductor substrate described, a well, a monocrystalline silicon film, a polycrystalline silicon film, an amorphous silicon film, a compound semiconductor substrate, and a compound semiconductor film.

(b) The conductive film includes, in addition to the doped polysilicon film described, an amorphous silicon film, a monocrystalline silicon film, various metal films including refractory metals, and metals of various conductive materials such as a metal silicide film.

(c) The coupling capacitance between the floating gate and the substrate includes the coupling capacitance between a floating gate electrode and a source/drain region and/or a channel region formed on the substrate.

(d) Pulling out electrons in a floating gate electrode to the side of the substrate includes pulling out electrodes to a source/drain region and/or a channel region formed on the substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A transistor array, comprising:
a semiconductor substrate having a main surface and
a plurality of transistors arranged in a matrix on the main surface of said semiconductor substrate,
each of said plurality of transistors, comprising:
first and second impurity regions to be source and drain regions formed on the main surface of said semiconductor substrate and having a channel region therebetween;
first and second floating gate electrodes positioned apart from each other on said channel region; and
one common control gate electrode extending on said first and second floating gate electrodes,
first and second transistors of said plurality of transistors arranged adjacently in a row-direction using said source or drain region commonly,
the control gate electrodes of said plurality of transistors arranged in the row-direction extending in a direction passing over both said source and drain regions to form a common word line,
in each of said plurality of transistors, the coupling capacitance between said floating gate electrode and said control gate electrode being set larger than the coupling capacitance between said floating gate electrode and said semiconductor substrate, wherein
the control gate electrodes and common word line are homogenous.

2. The transistor array as recited in claim 1, wherein a common word line is formed by the control gate electrodes of transistors arranged in the row-direction.

3. The transistor array as recited in claim 1, wherein the floating gate electrodes of transistors connected to a common word line are arranged in series to form a circuit, and said circuit is connected parallel to a common bit line to form an AND-NOR type structure.

4. The non-volatile semiconductor memory using the transistor array as recited in claim 1 as a memory cell array.

5. The transistor array as recited in claim 1 wherein
said each transistor further comprises a gate insulating film formed on said channel region;
said first floating gate electrode is positioned in the vicinity of said first impurity region on said gate insulating film;
said second floating gate electrode is positioned in the vicinity of said second impurity region on said gate insulating film; and
said common control gate electrode is formed on said first and second floating gate electrodes with a tunnel insulating film therebetween.

6. The transistor array as recited in claim 5, wherein said each transistor has a symmetrical structure relative to a virtual line drawn in the middle between said first floating gate electrode and said second floating gate electrode and perpendicular to the main surface of said semiconductor substrate.

7. The transistor array as recited in claim 5, wherein a part of said control gate electrode positioned between said first and second floating gate electrodes is located along the top of said channel region to form a select gate.

8. The transistor array as recited in claim 5, wherein
cell current is passed from the second impurity region to the first impurity region, a depletion layer extending from the second impurity region to the first impurity region, a high electric field is generated between the channel region and the first floating gate electrode by coupling through capacitance between the control gate electrode and the first floating gate electrode so that electrons are accelerated to be hot electrons in the channel region, the hot electrons are injected to the first floating gate electrode to allow the first floating gate electrode to store charge, and data corresponding to the charge is written and stored.

9. The transistor array as recited in claim 5, wherein
said first impurity region is grounded through a constant current source, first voltage is applied to the second impurity region, second voltage at a level higher than the first voltage is applied to the control gate electrode, electrons in the first impurity region move to the channel region in an inverted state, a depletion layer extending from the second impurity region to the first impurity region to pass cell current from the second impurity region to the first impurity region, coupling through capacitance between the control gate electrode and the first floating gate electrode raises the potential of the first floating gate electrode, a high electric field is generated between the channel region and the first floating gate electrode to accelerate electrons to be hot electrons in the channel region, the hot electrons are injected to the first floating gate electrode to allow the first floating gate to store charge, and data corresponding to the charge is written and stored.

10. The transistor array as recited in claim 5, wherein
the value of data stored at the first floating gate electrode is read out based on the value of cell current passed from the second impurity region to the first impurity region as a depletion layer extends from the second impurity region to the first impurity region.

11. The transistor array as recited in claim 5, wherein
as a depletion layer extends from the second impurity region to the first impurity region, the channel region immediately under the first floating gate electrode in an erased state is in an on state, the channel region immediately under the first floating gate electrode in a written state is almost in an off state, cell current passed from the second impurity region to the first impurity region is larger when the first floating gate electrode is in the erased state than in the written state, so that the value of the data stored at the floating gate electrode is read based on the value of the cell current.

12. The transistor array as recited in claim 5, wherein
third voltage is applied to the second impurity region, fourth voltage at a level lower than the third voltage is applied to the first impurity region, fifth voltage is applied to the control gate electrode, as a depletion layer extends from the second impurity region to the first impurity region, the channel region immediately under the first floating gate electrode in an erased state is in an on state, the channel region immediately under the first floating gate electrode in the written state is in a state close to an off state, cell current passed from the second impurity region to the first impurity region is larger in the erased state than in the written state, so that the value of data stored at the first floating gate electrode is read out based on the value of the cell current.

13. The transistor array as recited in claim 5, wherein electrons in the first and second floating gate electrodes are pulled out to the side of the substrate, and data stored at the first and second floating gate electrodes is erased.

14. The transistor array as recited in claim 5, wherein sixth voltage is applied to the first and second impurity regions, seventh voltage at a level lower than the sixth voltage is applied to the control gate, the first and second floating gate electrodes strongly coupling the control gate have their potentials changed little from the seventh voltage, the potential differences between the first and second impurity regions and the first and second floating gate electrodes increase, a high electric field is generated between the first and second impurity regions and the first and second floating gate electrodes to allow Fowler-Nordheim tunnel current to pass, electrons in the first and second floating gate electrodes are pulled out to the side of the substrate, and data stored at the first and second floating gate electrodes is erased.

* * * * *